(12) United States Patent
Michaeli et al.

(10) Patent No.: US 11,251,996 B2
(45) Date of Patent: Feb. 15, 2022

(54) MODULATING SIGNAL LEVEL TRANSITIONS TO INCREASE DATA THROUGHPUT OVER COMMUNICATION CHANNELS

(71) Applicant: CipherSiP Systems LTD, Beit Uziel (IL)

(72) Inventors: David Michaeli, Haifa (IL); Rami Ezer, Herzliya (IL); Yuval Yizhaq Maran, Kibbutz HaMaApil (IL); Eldad Caspi, Yuvalim (IL)

(73) Assignee: CipherSiP Systems LTD, Beit Uziel (IL)

( * ) Notice: Subject to any disclaimer, the term of this patent is extended or adjusted under 35 U.S.C. 154(b) by 0 days.

(21) Appl. No.: 17/253,167

(22) PCT Filed: Jul. 17, 2019

(86) PCT No.: PCT/IB2019/056099
§ 371 (c)(1),
(2) Date: Dec. 17, 2020

(87) PCT Pub. No.: WO2020/021392
PCT Pub. Date: Jan. 30, 2020

(65) Prior Publication Data
US 2021/0266205 A1 Aug. 26, 2021

Related U.S. Application Data

(60) Provisional application No. 62/702,392, filed on Jul. 24, 2018, provisional application No. 62/733,712, filed on Sep. 20, 2018.

(51) Int. Cl.
*H04L 27/00* (2006.01)
*H04L 25/493* (2006.01)
*H03K 5/1534* (2006.01)

(52) U.S. Cl.
CPC ......... *H04L 25/493* (2013.01); *H03K 5/1534* (2013.01)

(58) Field of Classification Search
CPC ............................ H04L 25/493; H03K 5/1534
(Continued)

(56) References Cited

U.S. PATENT DOCUMENTS 4,713,841 A * 12/1987 Porter .................. H04B 14/026
375/238
6,463,092 B1 * 10/2002 Kim .................... H04L 25/4902
375/219
(Continued)

FOREIGN PATENT DOCUMENTS

WO    WO 2020/021392    1/2020

OTHER PUBLICATIONS

International Search Report and the Written Opinion dated Sep. 20, 2019 From the International Searching Authority Re. Application No. PCT/IB2019/056099. (14 Pages).
(Continued)

*Primary Examiner* — Tesfaldet Bocure

(57) ABSTRACT

An encoder for modulating data on level transitions of a signal transmitted on a wired communication channel to increase channel data throughput, comprising a circuitry configured for receiving a signal transmitted by a transmitting communication node, the signal carries a message to one or more receiving communication nodes connected to a wired communication channel, calculating a respective delay period consisting of a number of delay time units encoding one or more data items, delaying one or more transitions of a waveform level of the signal by the respective delay period to modulate the signal to carry the data item(s) and transmitting the modulated signal to one or more
(Continued)

of the receiving communication nodes having a decoder configured for demodulating the modulated signal.

20 Claims, 13 Drawing Sheets

(58) Field of Classification Search
USPC .................................. 375/256, 257, 355, 376
See application file for complete search history.

(56) References Cited

U.S. PATENT DOCUMENTS

| 7,292,654 B2* | 11/2007 | Simon ..................... H04L 1/005 |
| | | 375/329 |
| 2005/0078018 A1* | 4/2005 | Cohen ..................... H03M 5/08 |
| | | 341/53 |
| 2008/0219380 A1 | 9/2008 | Payne et al. |
| 2010/0259363 A1 | 10/2010 | Landt et al. |

OTHER PUBLICATIONS

Written Opinion dated Jan. 30, 2020 From the International Preliminary Examining Authority Re. Application No. PCT/IB2019/056099. (5 Pages).

* cited by examiner

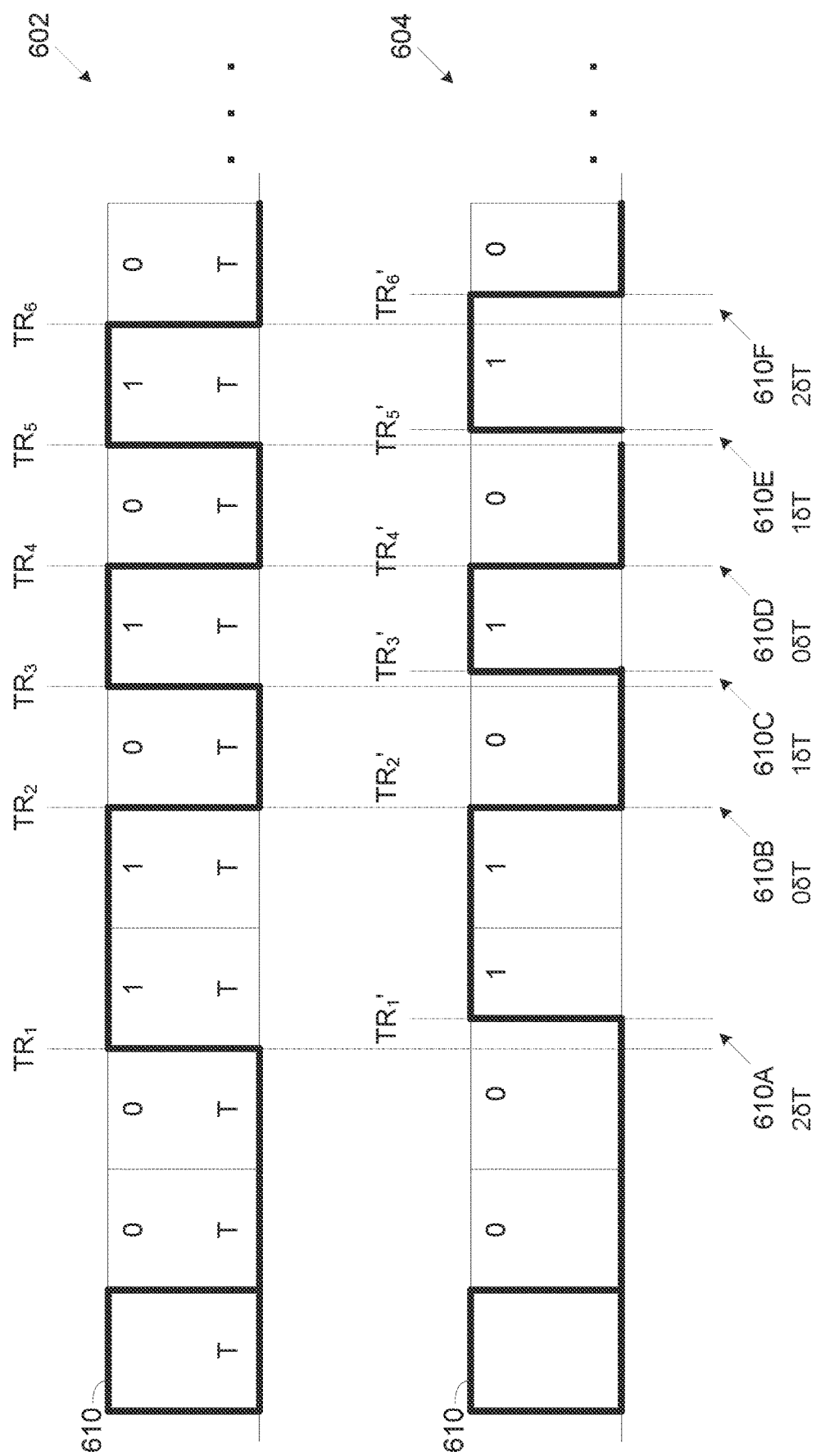

MODULATING SIGNAL LEVEL TRANSITIONS TO INCREASE DATA THROUGHPUT OVER COMMUNICATION CHANNELS

RELATED APPLICATIONS

This application is a National Phase of PCT Patent Application No. PCT/IB2019/056099 having International filing date of Jul. 17, 2019, which claims the benefit of priority under 35 USC § 119(e) of U.S. Provisional Patent Application Nos. 62/702,392 filed on Jul. 24, 2018 and 62/733,712 filed on Sep. 20, 2018. The contents of the above applications are all incorporated by reference as if fully set forth herein in their entirety.

BACKGROUND

The present invention, in some embodiments thereof, relates to increasing data throughput of wired, optical and wireless communication channels, and, more specifically, but not exclusively, to increasing data throughput of wired communication channels by modulating data on level transitions of transmitted messages signals.

Wired communication channels, for example, serial interconnections (e.g. RS-232, RS-422, RS-485, etc.), Controller Area Network (e.g. CAN, CANopen, CAN-FD, Single-Wire-CAN etc.), Local Interconnect Network (LIN), Ethernet, IO-Link, Serial Peripheral Interface (SPI), I²C, KNX, M-Bus, Modbus, Profibus, 10Base-T1L, 10Base-T1S, MIL-STD-1553, NRZ, RZ, Manchester line coding based communication protocols and/or optical (fiber optics, laser based), and/or the like are widely deployed in a plurality infrastructures, platforms and/or the like used by a plurality of systems, applications and/or services ranging from automotive and vehicular networks, through industrial infrastructures and medical environments to military systems.

The common and widespread use of such wired communication channels may be contributed to several benefits and advantages they present. First, due to the early adoption of such wired communication channels many industries, infrastructures, platforms and applications have historically built on these communication channels as their underlying communication infrastructure.

Moreover, the wired communication channels may be significantly more robust compared to wireless communication channels which may be subject to interference, jamming, limited coverage and/or the like.

Furthermore, the wired communication channels may be significantly more secure compared to the wireless communication channels which may easily intercepted, manipulated, attacked and/or compromised by malicious parties.

SUMMARY

According to a first aspect of the present invention there is provided an encoder for modulating data on level transitions of a signal transmitted on a wired communication channel to increase channel data throughput, comprising a circuitry configured for:

Receiving a signal transmitted by a transmitting communication node. The signal carries a message to one or more receiving communication nodes connected to a wired communication channel.

Calculating a respective delay period consisting of a number of delay time units encoding one or more data items.

Delaying one or more transitions of a waveform level of the signal by the respective delay period to modulate the signal to carry the one or more data items.

Transmitting the modulated signal to one or more of the receiving communication nodes having a decoder configured for demodulating the modulated signal.

According to a second aspect of the present invention there is provided a method of modulating data on level transitions of a signal transmitted on a wired communication channel to increase channel data throughput, comprising:

Receiving a signal transmitted by a transmitting communication node. The signal carries a message to one or more receiving communication nodes connected to a wired communication channel.

Calculating a respective delay period consisting of a number of delay time units encoding one or more data items.

Delaying one or more transitions of a waveform level of the signal by the respective delay period to modulate the signal to carry the one or more data items.

Transmitting the modulated signal to one or more of the receiving communication nodes having a decoder configured for demodulating the modulated signal.

According to a third aspect of the present invention there is provided a decoder for demodulating data encoded on level transitions of a signal transmitted on a wired communication channel to increase channel data throughput, comprising a circuitry configured for:

Receiving a modulated signal from an encoder connected to a wired communication channel. The modulated signal carries a message generated by a transmitting communication node.

Synchronizing a local sampling clock to a sampling clock of the transmitting communication node extracted from the modulated signal.

Demodulating the modulated signal to extract one or more data items carried by the modulated signal. The one or more data items are extracted by determining, based on the local sampling clock. A number of delay time units applied to delay one or more transitions of a waveform level of the modulated signal. The number of delay time units encodes the one or more data items.

Outputting the one or more extracted data items.

According to a fourth aspect of the present invention there is provided a method of demodulating data encoded on level transitions of a signal transmitted on a wired communication channel to increase channel data throughput, comprising:

Receiving a modulated signal from an encoder connected to a wired communication channel. The modulated signal carries a message generated by a transmitting communication node.

Synchronizing a local sampling clock to a sampling clock of the transmitting communication node extracted from the modulated signal.

Demodulating the modulated signal to extract one or more data items carried by the modulated signal. The one or more data items are extracted by determining, based on the local sampling clock. A number of delay time units applied to delay one or more transitions of a waveform level of the modulated signal. The number of delay time units encodes the one or more data items.

Outputting the one or more extracted data items.

Encoding the additional data items in the level transitions of the message signals' waveforms may allow constructing an overlaying communication link over the wired communication channel. Such an overlaying communication link may significantly increase the data throughput of the communication protocol utilized by the wired communication channel without affecting utilization of the wired communication channel. Specifically, no additional bandwidth is required for transmitting the additional data items since the bandwidth required for transmitting the modulated signals is similar to the bandwidth required for transmitting a corresponding non-modulated signal. The increased data throughput may be of special interest for enhancing legacy wired communication channels inherently suffering a limited throughput.

In a further implementation form of the first, second, third and/or fourth aspects, each of the encoder circuitry and the decoder circuitry is implemented in one or more forms, for example, a hardware circuit, an integrated circuit (IC), a semiconductor intellectual property core (IP core), a software module and/or a combination of at least two members thereof. Supporting a wide diverse range of implementation forms may provide great flexibility in designing, integrating, applying and/or deploying the encoder and/or decoder circuitries for different wired communication channels, buses and/or interfaces which may each present different requirement, imitations and/or challenges. Using the different implementation forms may allow adjusting and customizing the circuitry(s) according to the exact characteristics specific to each wired communication channel. Supporting the wide diverse range of implementation forms may thus increase adoption of the level transitions signal modulation in a plurality of applications, platforms and market segments.

In a further implementation form of the first, second, third and/or fourth aspects, one or more of the encoded data items are used for transmitting additional data in addition to data of the message to increase a data throughput of the wired communication channel. Increasing the data throughput of the underlining base wired communication channel may allow transferring significantly increased data volumes over the same infrastructure without increasing utilization of the wired communication channel and with minimal effect on the operational characteristics of the wired communication channel. This may be of particular interest to legacy wired communication channels utilizing communication protocols with inherently limited data throughput capacities.

In a further implementation form of the first, second, third and/or fourth aspects, one or more of the encoded data items are used for transmitting additional protocol data related to a communication protocol utilized by the wired communication channel for enhancing the communication protocol. Using additional data items to transmit protocol related data may allow enhancing the communication protocol utilized over the wired communication channel without increasing utilization and/or exceeding valid operational characteristics of the wired communication channel and/or the communication protocol.

In a further implementation form of the first, second, third and/or fourth aspects, one or more of the encoded data items are used for authenticating the transmitting communication node as originator of the message. Using the additional data items to transmit authentication data in order to apply an authentication protocol for the transmitting nodes may significantly increase security in the wired communication channel environment. This may be of specific interest for wired communication channels in which such authentication protocol are not feasible and/or may incur major overhead.

In a further implementation form of the first, second, third and/or fourth aspects, one or more of the encoded data items are used for authenticating the message. Using the additional data items to transmit authentication data in order to apply an authentication protocol for the transmitted messages may significantly increase security in the wired communication channel environment. This may be of specific interest for wired communication channels in which such authentication protocol are not feasible and/or may incur major overhead.

In a further implementation form of the first, second, third and/or fourth aspects, one or more of the encoded data items are used for transmitting error detection and correction data calculated for data of the message. Using the additional data items to transmit error correction codes (ECC) may significantly improve integrity of the transmitted data and may thus significantly increase robustness and immunity of the wired communication channel and the utilized communication protocol to interference such as, for example, noise, cross-talk, radiation and/or the like.

In a further implementation form of the first, second, third and/or fourth aspects, one or more of the encoded data items are used for transmitting update data for one or more of: a software update and a firmware update. Using the additional data items for software and/or firmware updates may allow field upgrades which may be highly data intensive and hence may not be feasible and/or may incur major overhead in legacy wired communication channels and protocols typically limited with respect to their data throughput.

In a further implementation form of the first, second, third and/or fourth aspects, the delayed level transition(s) are preceded by at least some non-delayed level transitions used by the decoder of one or more of the receiving communication nodes for synchronizing to the sampling clock of the signal. It is essential for the decoder to synchronize its local clock to the sampling clock of the encoder and of the transmitting communication node in order to correctly demodulate and decode the modulated signal. The non-delayed level transitions allow the decoder to recover the sampling clock from the modulated and hence synchronize its local sampling clock to the sampling clock of the transmitting communication node.

In an optional implementation form of the first, second, third and/or fourth aspects, one or more pilot signal transmitted by the encoder are used for calibrating the modulation between the encoder and the decoder. The encoder may apply one or more encoding settings which the decoder must be familiar with in order to correctly demodulate and decode the modulated signal. The pilot signals may be used to transfer theses encoding settings to the decoder. This may further allow dynamically adjusting the encoding setting(s) in real-time and using the pilot signal(s) to update the decoder about the adjusted encoding setting(s).

In a further implementation form of the first, second, third and/or fourth aspects, a duration of each delay time unit is adapted according to one or more operational parameters of a communication protocol utilized by the wired communication channel, the one or more operational parameters are members of a group consisting of: a frequency, an edge rise time of the one or more level transition, an edge fall time of the one or more level transition, a propagation time, a jitter, a clock drift and/or an interference. Adapting the encoding settings, specifically the delay time unit according to the operational parameter(s) of the communication protocol may ensure compliance of the modulated signal with the communication protocol. This may be particularly essential in case there are legacy communications nodes connected to the wired communication channel since such legacy communication nodes may be sensitive to deviation(s) from the communication protocol operational parameter(s) which may lead to operational degradation and potentially to operation failure of the legacy communication nodes.

In a further implementation form of the first, second, third and/or fourth aspects, a maximum number of delay time units applied to delay one or more of the level transitions is adapted according to one or more operational parameters of a communication protocol utilized by the wired communication channel, the one or more operational parameters are members of a group consisting of: a frequency, an edge rise time of the one or more level transition, an edge fall time of the one or more level transition, a propagation time, a jitter, a clock drift and/or an interference. Adapting the encoding settings, specifically the maximum number of delay time units according to the operational parameter(s) of the communication protocol may ensure compliance of the modulated signal with the communication protocol. This may be particularly essential in case there are legacy communications nodes connected to the wired communication channel since such legacy communication nodes may be sensitive to deviation(s) from the communication protocol operational parameter(s) which may lead to operational degradation and potentially to operation failure of the legacy communication nodes.

In an optional implementation form of the first, second, third and/or fourth aspects, one or more of the delayed level transitions are applied in one or more segments of the waveform. The segment(s) is defined according to a communication protocol utilized by the wired communication channel. Limiting the alterations of the level transitions to the defined segments may allow avoiding alterations of critical segment(s) of the modulated signal thus maintaining high signal integrity for these critical segment(s).

In a further implementation form of the first, second, third and/or fourth aspects, the delay period applied to the delayed level transition(s) is functionally transparent to legacy communication nodes connected to the wired communication channel and having no decoder. In some scenarios, communication nodes equipped with the encoder(s) and decoder(s) of the modulated signals may be deployed in environments in which legacy communication nodes are also present. Modulating the modulated signals such that the delayed level transition(s) are functionally transparent to the legacy communication nodes may be essential to maintain proper operation of the legacy communication nodes which may be sensitive to alterations of signals deviating from the operational parameter(s) of the communication protocol utilized by the wired communication channel.

In an optional implementation form of the first, second, third and/or fourth aspects, null modulation is applied to the modulated signal by constructing the delay period to include zero delay time units for all level transitions in the waveform of the signal. It may be highly desirable to avoid modulation of at least some signals transmitted by one or more transmitting communication nodes, specifically for critical messages. The modulation may therefore be disabled by using zero delay time units such that the modulated signal is substantially similar to a corresponding non-modulated signal.

In an optional implementation form of the first, second, third and/or fourth aspects, one or more segments of the waveform are scrambled to replace data encoded in the scrambled segment(s) with alternative data. Scrambling at least some segments of the modulated signal by, for example, applying a different coding scheme may significantly increase the number of level transitions and hence increase the number of data items which may be encoded in the modulated signal.

In an optional implementation form of the first, second, third and/or fourth aspects, one or more encoded data items are paired with at least some data of the message to make one or more of the encoded data items decodable based on the at least some message data. Pairing the encoded data item(s) with the message data may allow encrypting the message data and/or the additional data items since each of them may not be decoded separately. Moreover, by coupling the message data and the additional data items, at least part of the modulated signal may be scrambled with no extra effort, cost and/or resources.

In a further implementation form of the first, second, third and/or fourth aspects, the decoder circuitry is configured for outputting a recovered version of the modulated signal for extracting data of the message. The decoder recovers, from the modulated signal, the original message transmitted by the transmitting communication node in addition to decoding the additional data items encoded in the modulated signal.

In a further implementation form of the first, second, third and/or fourth aspects, the synchronizing is done according to sampling of at least some non-delayed level transitions of the waveform preceding the level transition(s). It is essential for the decoder to synchronize its local clock to the sampling clock of the encoder and of the transmitting communication node in order to correctly demodulate and decode the modulated signal. The non-delayed level transitions allow the decoder to recover the sampling clock from the modulated and hence synchronize its local sampling clock to the sampling clock of the transmitting communication node.

In a further implementation form of the first, second, third and/or fourth aspects, the synchronizing is done according to sampling of at least some predefined delayed level transitions of the waveform preceding the one or more level transitions. Each of the at least some predefined delayed level transitions is delayed by a predefined delay period. As described for the non-delayed level transitions, it is essential for the decoder to synchronize its local clock to the sampling clock of the encoder and of the transmitting communication node. The predefined delayed level transitions may therefore be used by the decoder (which is familiar with the delay value of the predefined delayed level transitions) to recover the sampling clock from the modulated in order to synchronize its local sampling clock to the sampling clock of the transmitting communication node.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions, parameters, encryption keys, decryption keys, and/or data and/or a non-volatile storage, for example, a magnetic hard-disk and/or removable media, of internal flash memory, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced In the drawings:

FIG. 6 is a schematic illustration of an exemplary message signal waveform modulated to encode additional data in the message signal, according to some embodiments of the present invention;

DETAILED DESCRIPTION

Figure 1:
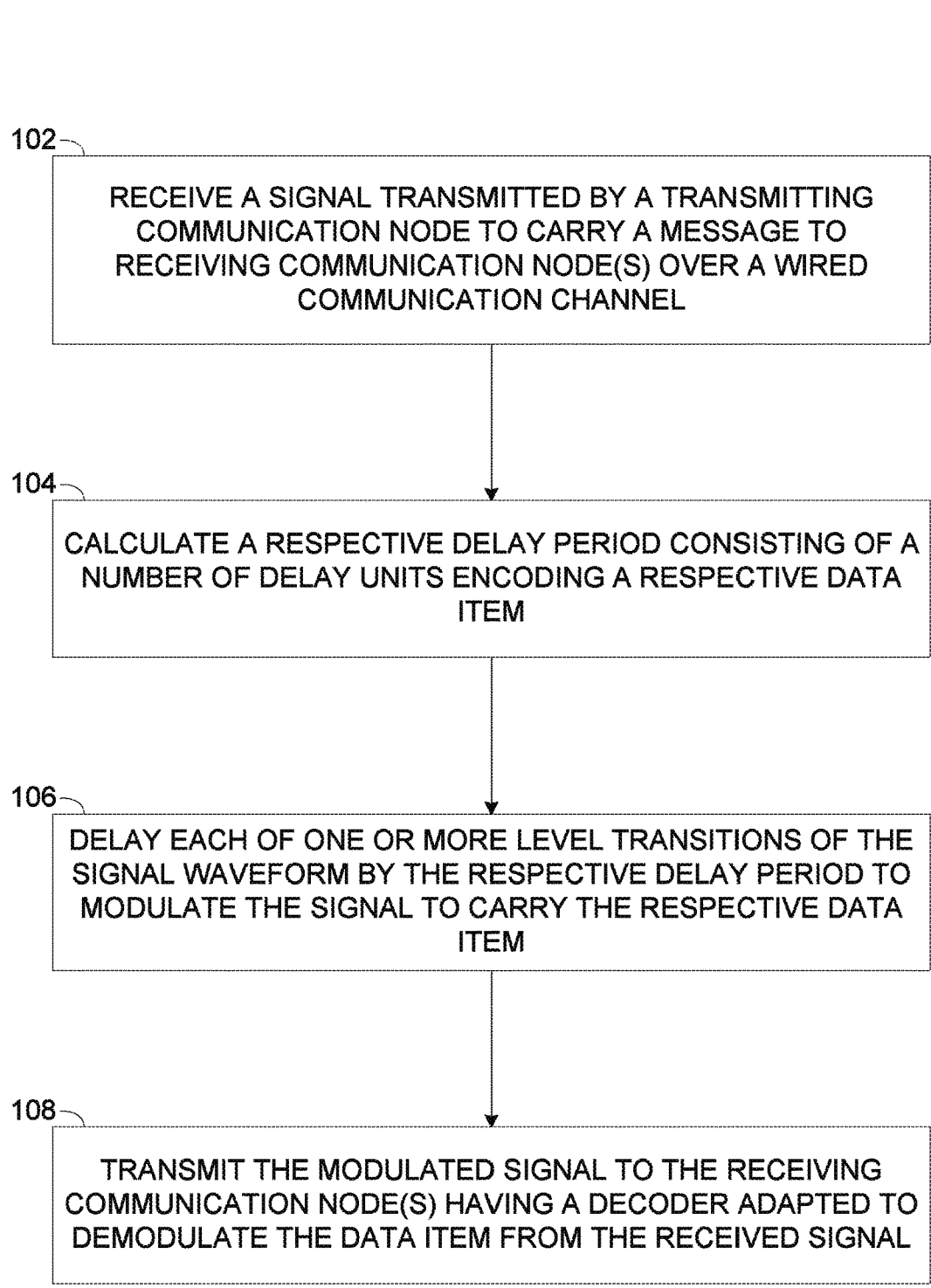
FIG. 1 is a flowchart of an exemplary process of modulating level transitions of a message signal transmitted on a wired communication channel to encode the message additional data, according to some embodiments of the present invention.

The present invention, in some embodiments thereof, relates to increasing data throughput of wired communication channels, and, more specifically, but not exclusively, to increasing data throughput of wired communication channels by modulating data on level transitions of transmitted messages signals.

According to some embodiments of the present invention, there are provided devices, systems, methods and computer program products for modulating a message signal transmitted over a wired communication channel to encode additional data items (symbols) in level transitions of the message signal to create an overlaying communication link over the wired communication channel.

One or more of a plurality of communications nodes connected the wired communication channel, for example, a serial interconnection (e.g. RS-232, RS-422, RS-485, etc.), a CAN bus (e.g. CAN, CANopen, CAN-FD, etc.), a LIN, an Ethernet link, an IO-Link, an SPI, an I$^2$C, a Modbus, a Profibus and/or the like may communicate with each other by exchanging messages over the wired communication channel.

At least some of the communications nodes may be associated with an encoder and/or a decoder adapted to modulate and demodulate respectively the modulated signals. The encoder and/or the decoder may be implemented, utilized and/or facilitated by one or more hardware components (e.g. a circuit, a component, etc.), logic elements (e.g. a core, an Intellectual Property (IP) core), software modules (e.g. a process, a script, an application, an agent, a utility, a service, a daemon, a tool, etc.). The encoder and/or the decoder may be independent devices bridging the communication nodes to the wired communication channel and/or integrated in one or more other devices. However, the encoder and/or the decoder may be integrated in one or more circuits, components and/or devices, for example, a communications node, a PHY adapted to condition the messages signals, a connector and/or the like.

The encoder of a transmitting communication node may modulate the message signal received from its associated transmitting communication node to create the modulated signal by delaying one or more of the level transitions in the message signal waveform to encode one or more of the additional data items.

The encoder may delay each delayed level transition by a delay period consisting of a number of delay time units mapping a respective one of the additional data items (symbols). As such each delay period encodes a respective data item (symbol), for example, a delay period consisting of a first number of delay time units (e.g. 0) may map a first data item (e.g. "00"), a delay period consisting of a second number of delay time units (e.g. 1) may map a second data item (e.g. "01"), a delay period consisting of a third number of delay time units (e.g. 2) may map a third data item (e.g. "10"), a delay period consisting of a fourth number of delay time units (e.g. 3) may map a fourth data item (e.g. "11") and so on. Of course a plurality of other mapping schemes may be applied.

The encoder may transmit the modulated signal in which one or more of the level transitions are delayed to one or more receiving communication nodes connected to the wired communication channel.

The encoder may avoid delaying at least some level transitions of the modulated signal waveform, specifically at the beginning of the modulated signal to support the decoder in synchronizing its local sampling clock to the sampling clock of the encoder (and hence to the sampling clock of the originating communication node) by recovering the clock from the modulated signal.

After synchronizing its local sampling clock by recovering the clock from the modulated signal, the decoder associated with each receiving communication node may demodulate the received modulated signal by measuring the delay period applied to each delayed level transition to identify the number of delay time units applied to delay the level transition and extract the mapped data item according to the mapping scheme.

The decoder may create a recovered version of the modulated signal which corresponds to the message signal originally generated by the transmitting communication node.

The decoder may output the recovered message signal and the additional data item(s) extracted from the level transition(s) of the modulated signal.

Optionally, the encoder transmits to the decoder(s) one or more pilot signals preceding the modulated signal. The pilot signal(s) may include calibration information that may be used by the decoder to calibrate and adjust according to one or more encoding setting applied by the encoder.

The duration of the delay time units and the maximum number of delay time units by which the encoder may delay each of the delayed level transitions may be adapted and/or predefined according to one or more operational parameters of the communication protocol utilized by the wired communication channel, specifically timing parameters, for example, a frequency, an edge rise time of level transition, an edge fall time of the at least one transition, a propagation time, a jitter, a clock drift and an interference.

Evidently it may be highly desirable to have a large set of delay periods in order to map a large set of additional data items (symbols) and hence increase the amount of additional data that may be overlaid on the message signal. However, the duration of the delay time units may be set, configured and/or adapted to be sufficiently long to sustain sufficient resolution to allow the decoder to distinguish between consecutive delay time units and properly measure the delay period to demodulate the modulated signal. The duration and/or maximum number of the delay time units may be further adapted to provide an optimal tradeoff between the number of data items which may be mapped by the number of delay time units and the resolution of the delay time units while maintaining the timing parameter(s) of the communication protocol.

Optionally, the encoder dynamically adapts in real-time the duration and/or maximum number of delay time units according to one or more of the operational parameters of the communication protocol detected in real time, for example, the frequency, the jitter, the propagation delay and/or the like. The encoder may report the selected encoding settings, the duration and/or maximum number of the delay time units to the decoder through one or more of the pilot signals to maintain compatibility between the encoder and the decoder demodulating the modulated signals.

Optionally, the encoder applies null modulation in which each delayed level transition is delayed by zero delay time units such that the modulated signal is substantially similar to the non-modulated signal received from the transmitting communication node. The null modulation may be applied, for example, by modulating each of the level transitions with a zero delay period. In another example, the encoder may be turned off while the communication node directly transmits over the wired communication channel.

The signal modulation to create the overlaying communication link over the wired communication channel by encoding the additional data items in the level transitions of the message signals may present significant benefits and advantages.

First, by encoding the additional data items in the waveforms of the message signals, the data throughput of the communication protocol utilized by the wired communication channel may be significantly increased without affecting utilization of the wired communication channel. For example, no additional bandwidth is required for transmitting the additional data items since the bandwidth required for transmitting the modulated signals is similar to the bandwidth required for transmitting a corresponding non-modulated signal. The operational parameters of the communication protocol used for transmitting the modulated signals are also maintained similar to those used for transmitting the non-modulated signals. The increased data throughput may be of special interest for enhancing legacy wired communication channels which may have limited throughput.

Moreover, adapting the duration and/or maximum number of the delay time units according to the communication protocol timing parameters may ensure that the overall delay period applied to each level transition in the modulated signals does not violate the timing parameters defined by the communication protocol. Since violating the timing parameter(s) may significantly degrade the integrity of the modulated signals waveform and may lead to communication failures, fully complying with the timing parameter(s) of the communication protocol may ensure the integrity of the modulated signals.

Furthermore, since the timing parameters of the communication protocol are maintained, legacy devices which do not have the encoder and/or the decoder may connect and communicate over the wired communication channel. While the overlaid communication link comprising the additional data items is transparent to them, the legacy devices may still decode the modulated signals to extract the message data encoded in the modulated signals.

In addition, dynamically adapting the duration and/or maximum number of the delay time units according to the communication protocol timing parameter(s) detected in real time may further improve compliance with the communication protocol in the detected operation conditions which may vary between deployments of the wired communication channel. Such dynamic adjustment of the duration and/or maximum number of the delay time units may also allow for optimizing the amount of additional data items that may be encoded in each level transition while maintaining compliance with the communication protocol timing parameters.

The overlaying communication link constructed of the additional data items may be used for a plurality of applications which may improve and/or add features to the communication protocol utilized by the wired communication channel. This may be of particular benefit for enhancing legacy wired communication channels which may be limited in their capabilities, feature set and/or operational characteristics. For example, the overlaying communication link may be used for increasing the throughput of data transfer over the wired communication channel. In another example, the overlaying communication link may be used to support error detection and correction in the message data by adding Error Correction codes (ECC) for one or more of the messages in the additional data item(s). In another example, the overlaying communication link may be used for message originator authentication by including an identifier uniquely assigned to each transmitting communication node and/or by adding a cipher hash key generated using one or more industry standard cryptographic authentication methods (e.g. HMAC, CMAC, etc.) in the additional data item(s) to identify and authenticate the originator of the transmitted message(s). In another example, the overlaying communication link may be used for security by encrypting the additional data items to perform secured hidden communication layer. In another example, symmetric and/or asymmetric encryption key distribution can be performed inside the additional data items. Moreover, a private-public key scheme may be employed using the additional data items to validate both the originating communication node of the message(s) as well as the messages validity, i.e. verify the message content is genuine and has not been altered since transmitted by the originator. In another example, the overlaying communication link may be used for software and/or firmware upgrades by transmitting software update elements using the additional data item(s) modulated in one or more messages. As software/firmware updates may require transferring a large volume of data, the limited throughput of the communication channel may be insufficient. The overlaying communication link may therefore enable and/or significantly improve the software and/or firmware upgrade.

Also applying null modulation by turning off the encoder (and hence the decoder which is not needed since the signal transmitted over the wired communication channel is not modulated) may reduce power consumption. This may be of particular benefit in cases when no additional data items need to be modulated in the signals of the messages transmitted over the wired communication channel, for example, in case the bandwidth of the wired communication channel is sufficient, in case no additional functionality (e.g. ECC, authentication, encryption, etc.) is required and/or the like. Moreover, some messages message segment(s), message signals and/or the like may be sensitive and vulnerable to alterations in the signal timing, specifically to delays in the level transitions. To verify compliance and/or integrity of such sensitive messages and/or signals, null modulation may be applied to these sensitive messages and/or signals.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
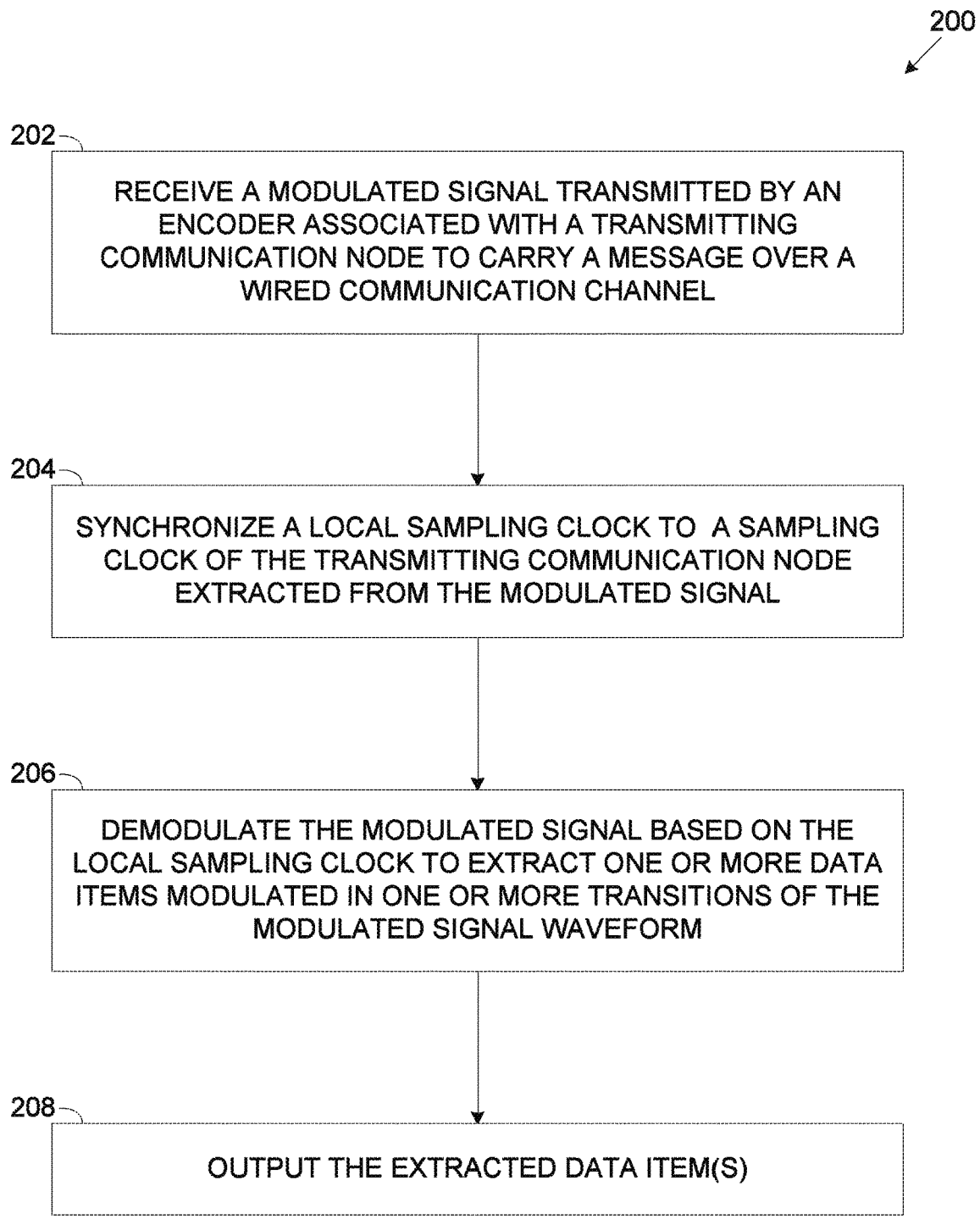
FIG. 2 is a flowchart of an exemplary process of demodulating level transitions of a message signal received on a wired communication channel to decode additional data encoded in the message, according to some embodiments of the present invention.

Referring now to the drawings, FIG. 1 is a flowchart of an exemplary process of modulating level transitions of a message signal transmitted on a wired communication channel to encode the message additional data, according to some embodiments of the present invention. FIG. 2 is a flowchart of an exemplary process of demodulating level transitions of a message signal received on a wired communication channel to decode additional data encoded in the message, according to some embodiments of the present invention.

An exemplary process 100 may be executed by an encoder to modulate additional data on level transitions of a waveform of a message signal transmitted over a wired communication channel. Each additional data item (symbol) is encoded in the message signal by delaying one of the level transitions of the signal waveform by a delay period calculated to encode the respective data item in a respective number of predefined delay time units. As such, one data item may be encoded in each modulated level transition of the message signal. An exemplary process 200 may be executed by a decoder to demodulate the additional data encoded on level transitions of a waveform of a message signal transmitted over a wired communication channel.

Figure 3A:
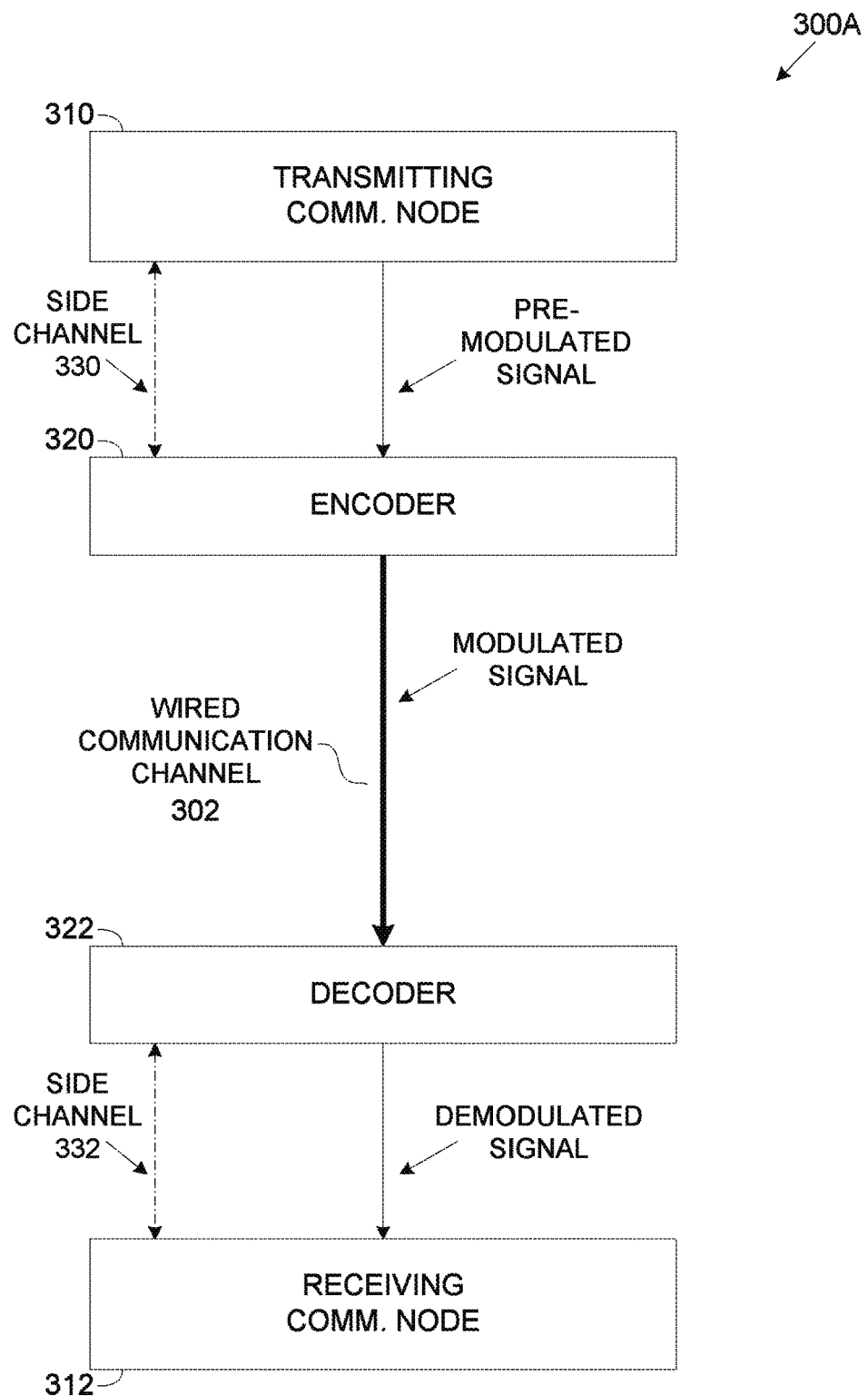
FIG. 3A and FIG. 3B are schematic illustrations of exemplary embodiments of a system for modulating and demodulating level transitions of a message signal transmitted on a wired communication channel to transfer additional data in the message, according to some embodiments of the present invention.
Figure 3B:
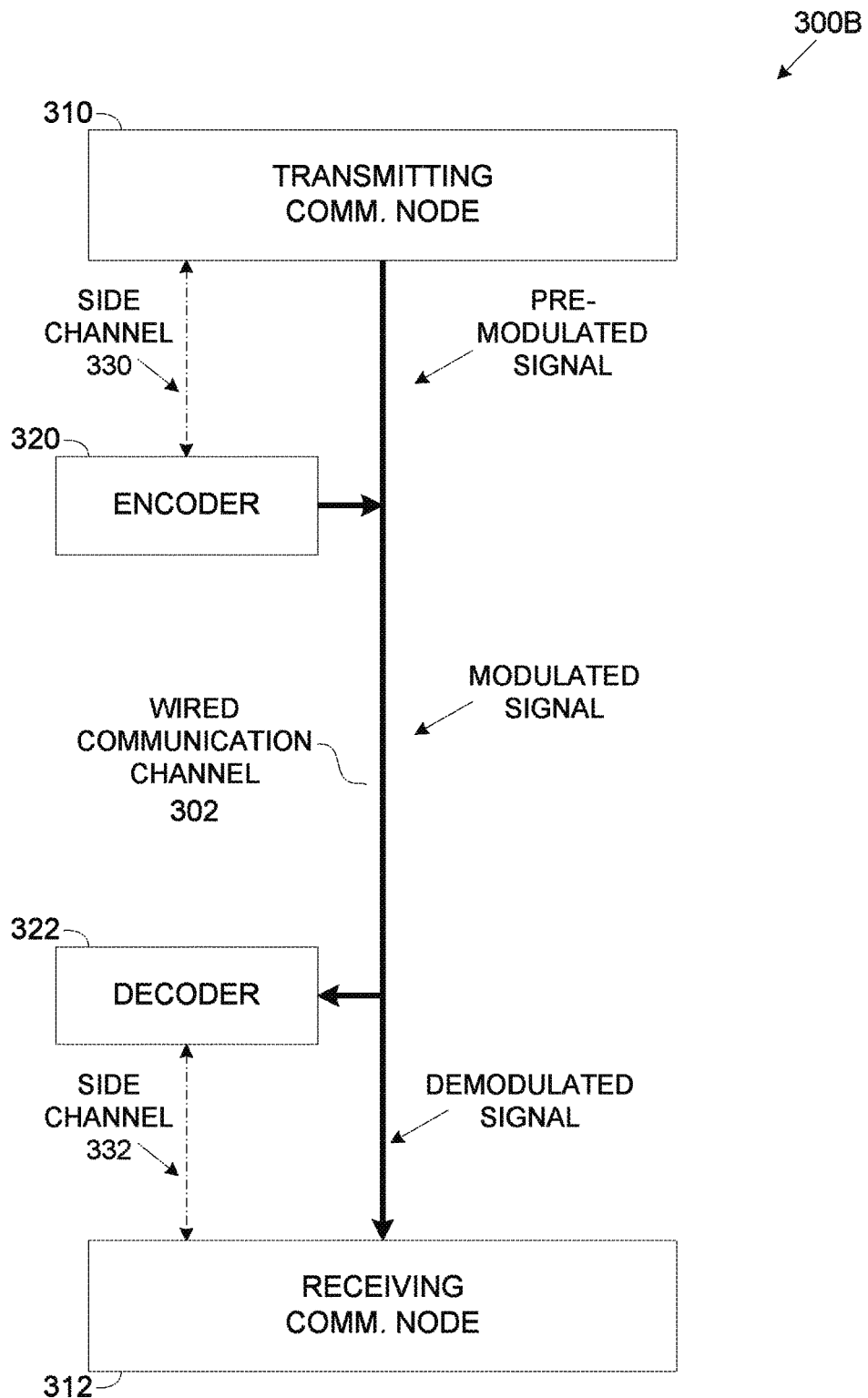

Reference is also made to FIG. 3A and FIG. 3B, which are schematic illustrations of exemplary embodiments of a system for modulating and demodulating level transitions of a message signal transmitted on a wired communication channel to transfer additional data in the message, according to some embodiments of the present invention. Exemplary systems 300A and 300B for encoding and decoding additional data items modulated on level transitions in the message signal waveform transmitted over a wired communication channel 302 may be deployed in a plurality of communication environments, platforms, infrastructures and/or applications such as, for example, vehicular (e.g. vehicles, drones, etc.), industrial, military, medical and/or the like. The wired communication channel 302, for example, a bus, a point-to-point interconnection, a point-to-multipoint interconnection, a multi-drop interconnection and/or the like may support full-duplex protocols, half-duplex protocols and/or a combination thereof. The wired communication channel 302 may support a wide range of wired communication protocols, for example, serial (e.g. RS-232, RS-422, RS-485), CAN (e.g. CAN, CANopen, CAN-FD, etc.), LIN, Ethernet, IO-Link, SPI, $I^2C$, Modbus, Profibus, MIL-STD-1553 and/or the like.

The embodiments 300A and 300B present conceptual deployments of a unidirectional message flow from the encoder 320 to the decoder 322 and should not be construed as limiting since other deployments (some of which are described herein after) may be apparent to a person skilled in the art.

System embodiment 300A may include a transmitting communication (comm.) node 310 coupled with an encoder 320 adapted to execute the process 100 and a receiving communication node 312 coupled with a decoder 322 adapted to execute the process 200.

The encoder 320 may be connected as "buffer" (man-in-the-middle) between the transmitting communication node 310 and the wired communication channel 302. The connection between the encoder 320 and the transmitting communication node 310 may be similar to the wired communication channels 302. The transmitting communication node 310 may therefore maintain physical interface and operation as if it is connected directly to the wired communication channel 302 without the encoder 320 placed in between.

The encoder 320 may receive a message signal transmitted by the transmitting communication node 310 where the received signal is not modulated. The encoder 320 may generate a modulated signal in which additional data item(s) (symbol(s)) are encoded in one or more of the signal level transitions. The message(s) modulated by the encoder 320 are transmitted to the decoder 322 over a wired communication channel 302. The decoder 322 may receive the modulated signal transmitted over the wired communication channel 302 and demodulate the modulated signal to decode the additional data item(s) encoded in the signal level transition(s). The decoder 322 may output the demodulated signal to the receiving communication node 312.

As described for the encoder 320, the decoder 322 may be connected as "buffer" between the receiving communication node 312 and the wired communication channel 302. The decoder 322 connects to the receiving communication node 312 through a connection similar to the wired communication channel 302. The receiving communication node 312 may therefore maintain the physical interface and operation as if it is connected directly to the wired communication channels 302 without the decoder 322 connected in between.

Optionally, the encoder 320 communicates with the transmitting communication node 310 for transferring data and/or control/status information. For example, the transmitting communication node 310 may communicate with the encoder 320 to transfer data to be modulated on a message signal. In another example, the transmitting communication node 310 may communicate with the encoder 320 to configure the encoder 320 according to one or more operational parameters.

The communication between the encoder 320 and the transmitting communication node 310 may be established over the connection between the encoder 320 and the transmitting communication node 310 which follows the physical connection and protocol of the wired communication channel 302. For example, the encoder 320 may be assigned a unique address and/or message type which the transmitting communication node 310 may use to transmit messages to the encoder 320. Such messages may not be forwarded by the encoder 320 to the wired communication channel 302. For example, assuming the wired communication channel 302 is a CAN bus, the encoder 320 may be assigned a dedicated special Package Identifier (PID) which is not intended for transmission over the CAN bus. The transmitting communication node 310 may transfer data intended for the encoder 320 by transmitting messages assigned with the PID assigned to the encoder 320. The encoder 320 receiving such messages may identify the message's PID matches its own (the encoder 320) PID and may decode the message for its own use while avoiding transmitting the message over the CAN bus.

Optionally, the encoder 320 communicates with the transmitting communication node 310 through one or more dedicated side channels 330, for example, a serial bus, an SPI bus, an I²C bus and/or the like.

Optionally, as described for the encoder 320, the decoder 322 communicates with the receiving communication node 312 for transferring data and/or control/status information. Similarly to as described for the encoder 320, the decoder may communicate with the receiving communication node 312 through their primary connection which follows the physical connection and protocol of the wired communication channel 302. Optionally, as described for the encoder 320, the decoder 322 communicates with the receiving communication node 312 through one or more dedicated side channels 332 such as the dedicated side channel 330.

Optionally, the encoder 320 and/or the decoder 322 communicate through their respective dedicated side channels with one or more other devices other than the transmitting communication node 310 and/or the receiving communication node 312. For example, the encoder 320 connected to another device may receive from the other device data to be modulated on messages transmitted by the transmitting communication node 310. In another example, the decoder 322 connected to another device may transmit to the other device data modulated on messages directed to the receiving communication node 312.

System embodiment 300B includes the encoder 320 which is connected to the wired communication channel 302 as a "listener", i.e. in parallel to the transmitting communication node 310 such that both the encoder 320 and the transmitting communication node 310 connect directly to the wired communication channel 302. In such case, the transmitting communication node 310 may communicate with the encoder 320 through the side channel(s) 330 to provide message data as well as additional data items to be modulated with the message data. The side channel(s) 330 may be further used for transferring control/status information between the transmitting communication node 310 and the encoder 320.

Similarly, the decoder 322 may be connected to the wired communication channel 302 as a "listener", i.e. in parallel to the receiving communication node 312 such that both the decoder 322 and the receiving communication node 312 connect directly to the wired communication channel 302. In such case, the receiving communication node 312 may decode the receive message while the decoder 320 decode only the additional data items modulated on the message signal. The decoder 322 may optionally transmit the decoded additional data items to the receiving communication node 312 and/or to one or more other devices through the side channel(s) 332. The side channel(s) 332 may be further used for transferring control/status information between the receiving communication node 312 and the decoder 322.

As evident, in system deployment 300B the encoder 320 and/or the decoder 322 may be disabled and/or turned off without affecting transmission between the transmitting communication node 312 and the receiving communication node 312. This may be desired for one or more purposes, for example, reduce system power consumption, increase system integrity and/or the like.

Connecting the encoder 320 and/or the decoder 322 to the wired communication channel 302 as a "listener" as described in the embodiment 300B may have some limitations. First, such a connection may apply for communication channels and protocols which are tolerant to additional loads connected to the wired communication channel 302, for example, open collector type buses, such as, for example, CAN bus, I2C bus, SPI bus and/or the like. Other communication channels, for example, point-to-point channels such as, for example, Ethernet, serial bus (e.g. RS-232, RS-422, etc.) do not allow adding additional loads and the encoder 320 or the decoder 322 may therefore not be connected a "listeners".

Moreover, as implied by the term open-collector, the wired communication channels protocols that do support the "listener" connection are characterized by the low level voltage ("0") being the dominant level that is actively driven by the transmitting communication node(s) 310 driven on the wired communication channel 302 while the high level voltage ("1") is recessive meaning that it is not actively driven by the transmitting communication node(s) 310 but rather pulled to the high level voltage by a passive component. This means that the actual voltage level detected on the wired communication channel 302 is the result of an AND logic operation of all the loads (transmitters) connected to the wired communication channel 302. Therefore, in case the encoder 320 is connected to the wired communication channel 320 in parallel to the transmitting communication node 310 as a "listener", the encoder 320 may only modulate the additional data items on "0" to "1" level transitions. The inability to modulate the "1" to "0" level transitions may thus reduce the transfer rate of the additional data items. However, the specific implementation of the encoder 320 and/or the decoder 322 as a "buffer" or a "listener" may depend on overall system requirements and feasible tradeoffs.

Some systems and/or communication channel deployments may employ a combination of the encoder 320 and decoder 322 connections and deployments described in the embodiments 300A and 300B. For example, a certain system may include one or more transmitting communication nodes 310 connected to the wired communication channel 302 through an encoder 320 connected as a "buffer" (300A) while one or more receiving communication nodes 312 may be connected directly to the wired communication channel 302 with a decoder 322 connected to the wired communication channel 302 in parallel as a "listener" (300B). In another example, a certain system may include one or more transmitting communication nodes 310 connected to the wired communication channel 302 through an encoder 320 connected as a "buffer" (300A) while one or more other transmitting communication nodes 310 are connected directly to the wired communication channel 302 with an encoder 320 connected to the wired communication channel 302 in parallel as a "listener" (300B).

Figure 4A:
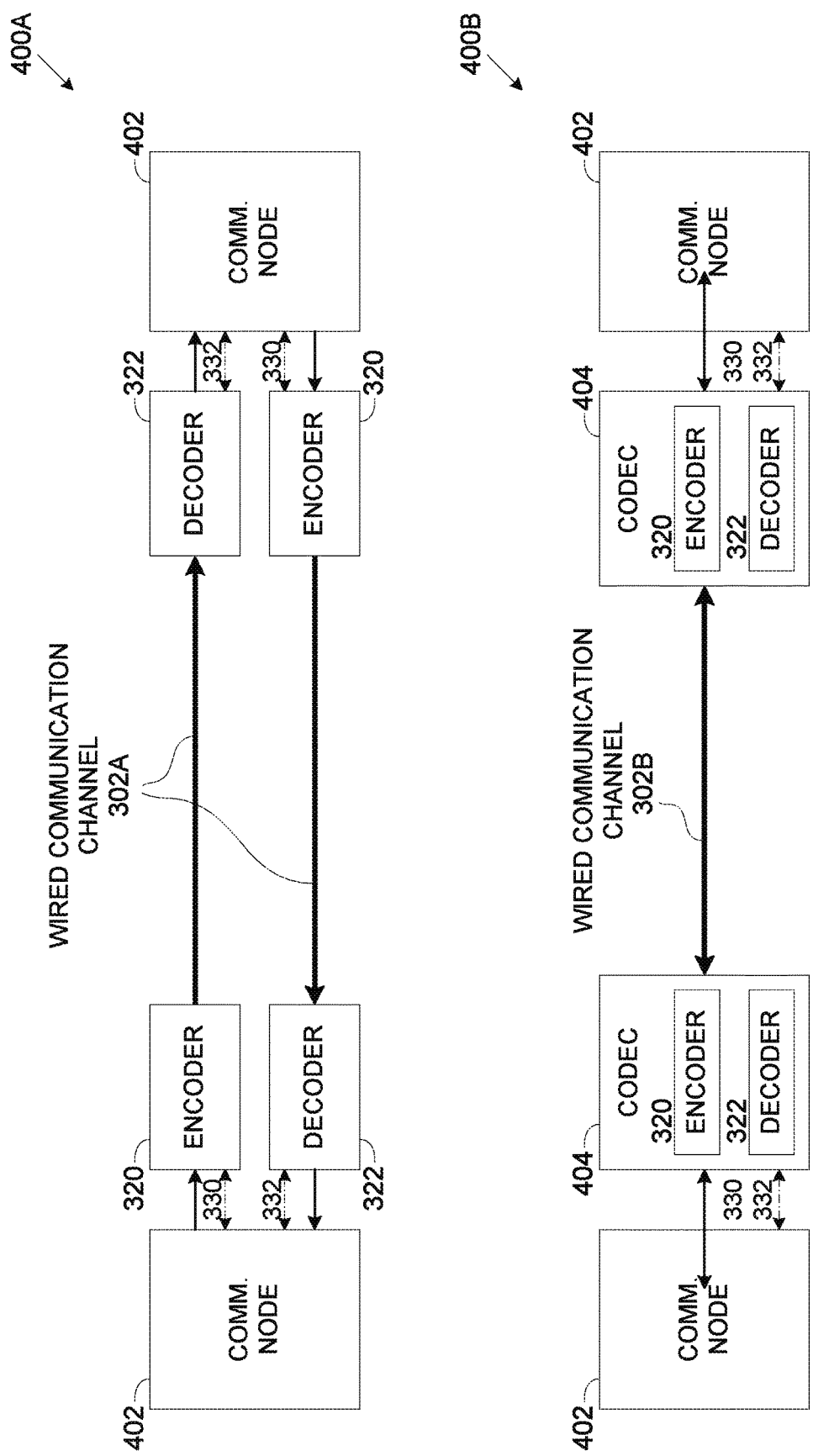
FIG. 4A and FIG. 4B are schematic illustrations of exemplary wired communication channel deployments for modulating additional data on level transitions of a message signal transmitted on a wired communication channel, according to some embodiments of the present invention.
Figure 4B:
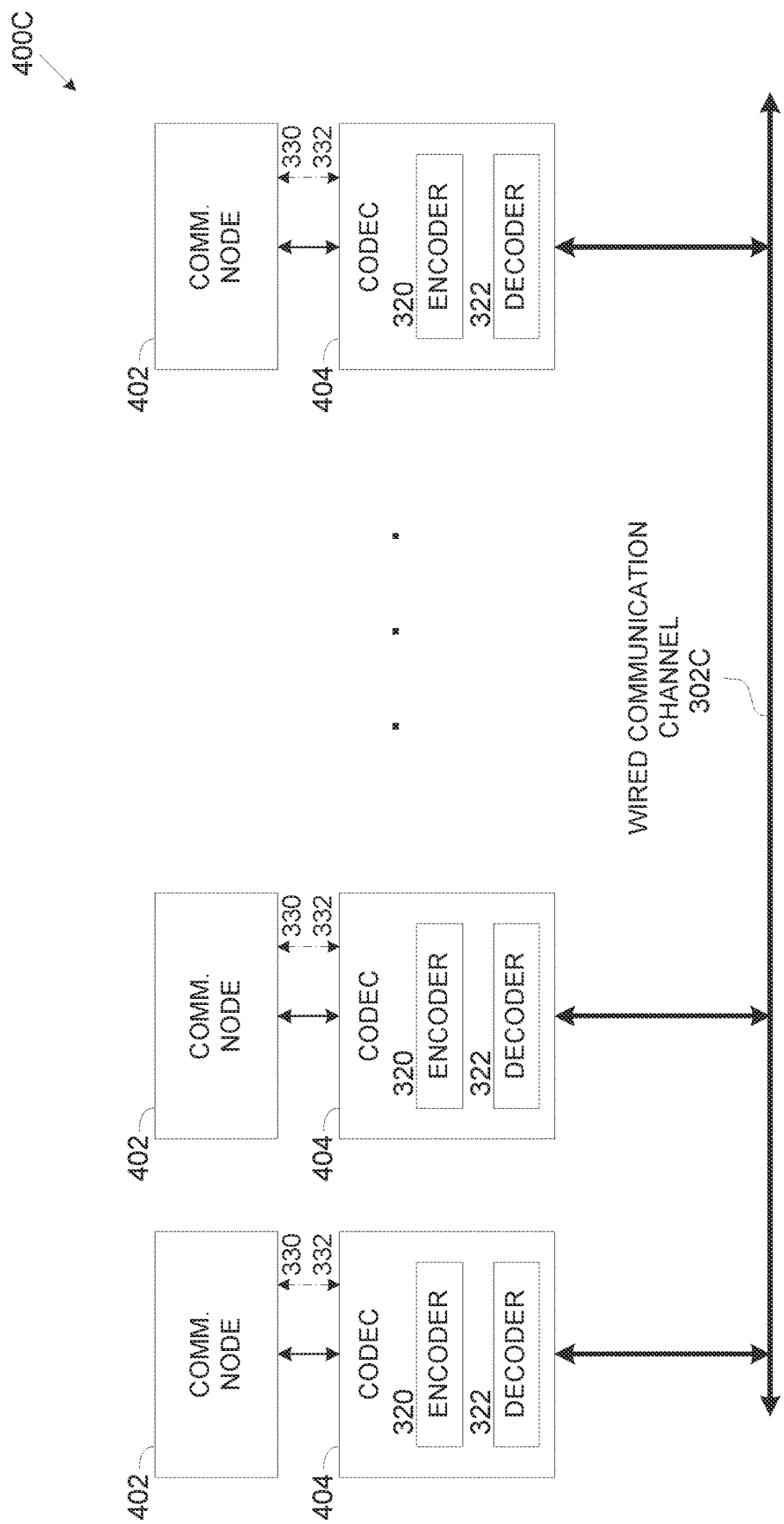

Reference is also made to FIG. 4A and FIG. 4B, which are schematic illustrations of exemplary wired communication channel deployments for modulating additional data on level transitions of a message signal transmitted on a wired communication channel, according to some embodiments of the present invention.

Exemplary wired communication channel deployments 400A, 400B and 400C present communication nodes 402 communicating over a wired communication channel such as the wired communication channel 302. It should be noted that for completeness each of the communication nodes 402 is associated with an encoder such as the encoder 320 and a decoder such as the decoder 322. This however, should not be construed as limiting since one or more of the communication nodes 402 may be associated with only an encoder 320 or only a decoder 322. For example, a transmit-only communication node 402 may be associated with only an encoder 320 while a receive-only communication node 402 may be associated with only a decoder 322. Moreover, the exemplary wired communication channel deployments 400A, 400B and 400C present a "buffer" implementation in which the encoder 320 and the decoder 322 are placed between the communication nodes 402 and the wired communication channel 302. However, other connection implementation such as the "listener" and/or a combination of the "buffer" connection and "listener" connection may be applied to one or more of the wired communication channel deployments 400A, 400B and 400C.

The exemplary wired communication channel deployment 400A includes a point-to-point full-duplex wired communication channel 302A connecting between two communication nodes 402 each coupled with an encoder 320 and a decoder 322. Each of the communication nodes 402 may perform as a transmitting communication node such as the transmitting communication node 310 and/or as a receiving communication node such as the receiving communication node 312. Moreover, since the wired communication channel 302A supports full-duplex operation, the two communication nodes 402 may simultaneously transmit messages to each other.

An exemplary wired communication channel deployment 400B includes a point-to-point half-duplex wired communication channel 302B connecting between two communication nodes 402 each coupled with a codec 404 comprising an encoder 320 and a decoder 322. Each of the communication nodes 402 may perform as the transmitting communication node 310 and/or as the receiving communication node 312. However, since the wired communication channel 302B supports half-duplex operation, only one of the two communication nodes 402 may acquire ownership of the wired communication channel 302B at any given time for transmitting a message to the other communication node 402.

An exemplary wired communication channel deployment 400C includes a multi-point (multi-drop) wired communication channel 302C connecting a plurality of communication nodes 402 each coupled with a codec 404 comprising an encoder 320 and a decoder 322. Optionally, one or more of the communication nodes 402 may be a receive-only device and may optionally include only the decoder 322 rather than the codec 404. Similarly, one or more of the communication nodes 402 may optionally be a transmit-only device and may optionally include only the encoder 320 rather than the codec 404. Each of the communication nodes 402 (having the encoder 320) may perform as the transmitting communication node 310 and/or as the receiving communication node 312. However, since the wired communication channel 302C is a multi-point connection, only one of the two communication nodes 402 may acquire ownership of the wired communication channel 302C at any given time for transmitting a message to one or more of the other communication nodes 402.

The codec 404, encoder 320 and/or the decoder 322 may be implemented, utilized and/or facilitated by one or more hardware components, logic elements, software modules and/or a combination thereof.

Figure 5A:
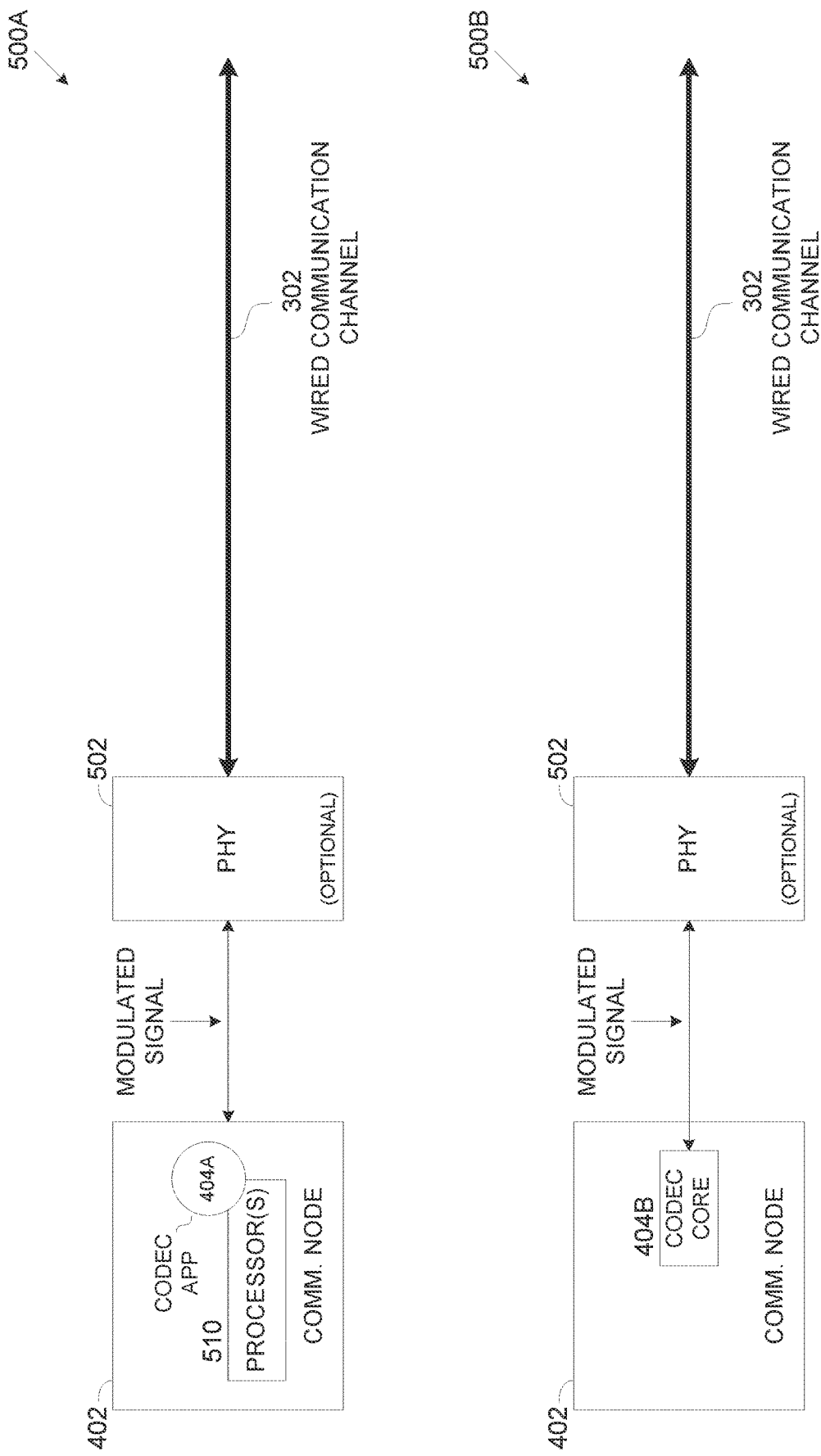
FIG. 5A, FIG. 5B and FIG. 5C are schematic illustrations of exemplary embodiments of a codec implementation for modulating additional data on level transitions of a message signal transmitted on a wired communication channel, according to some embodiments of the present invention.
Figure 5B:
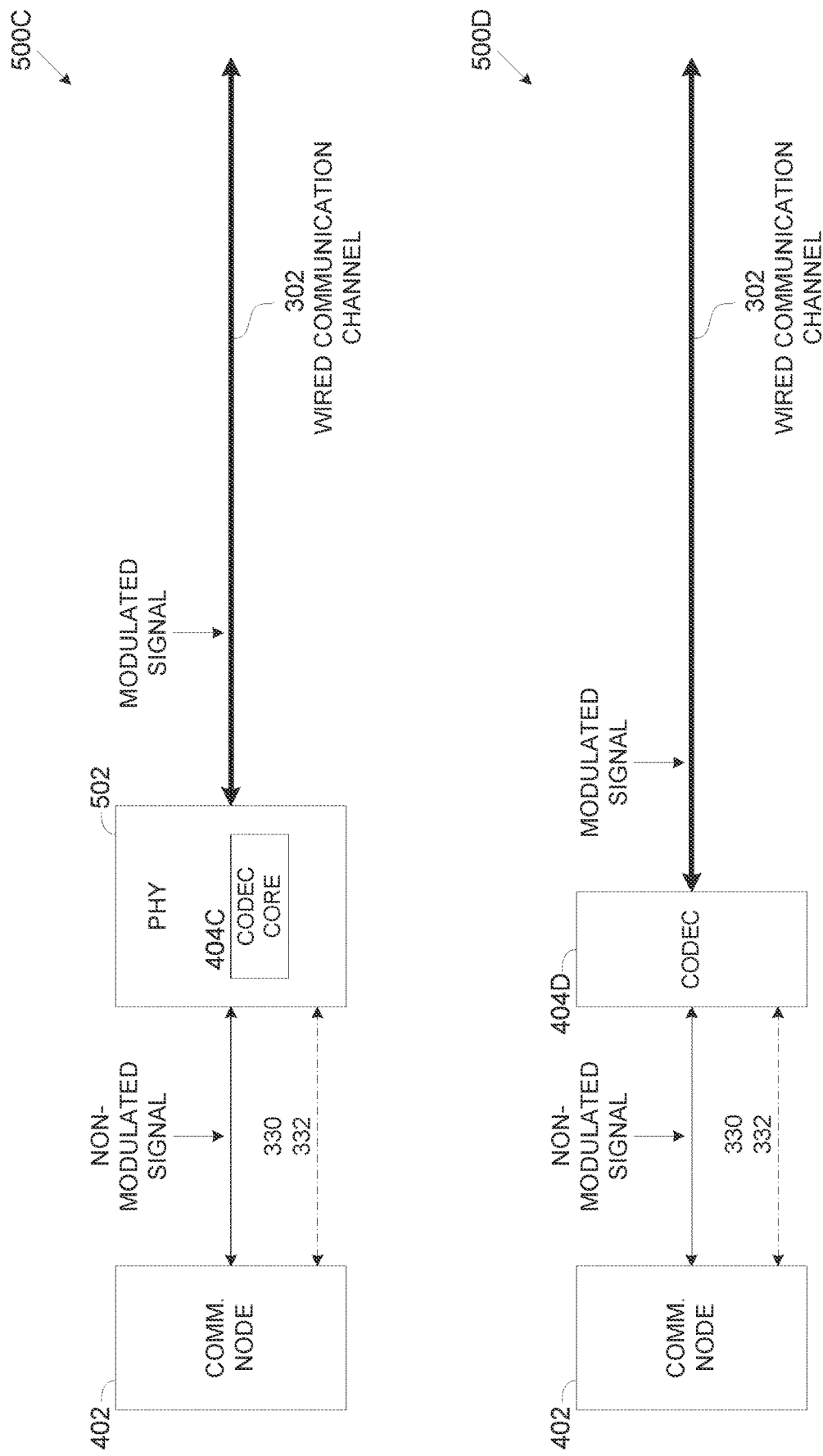
Figure 5C:
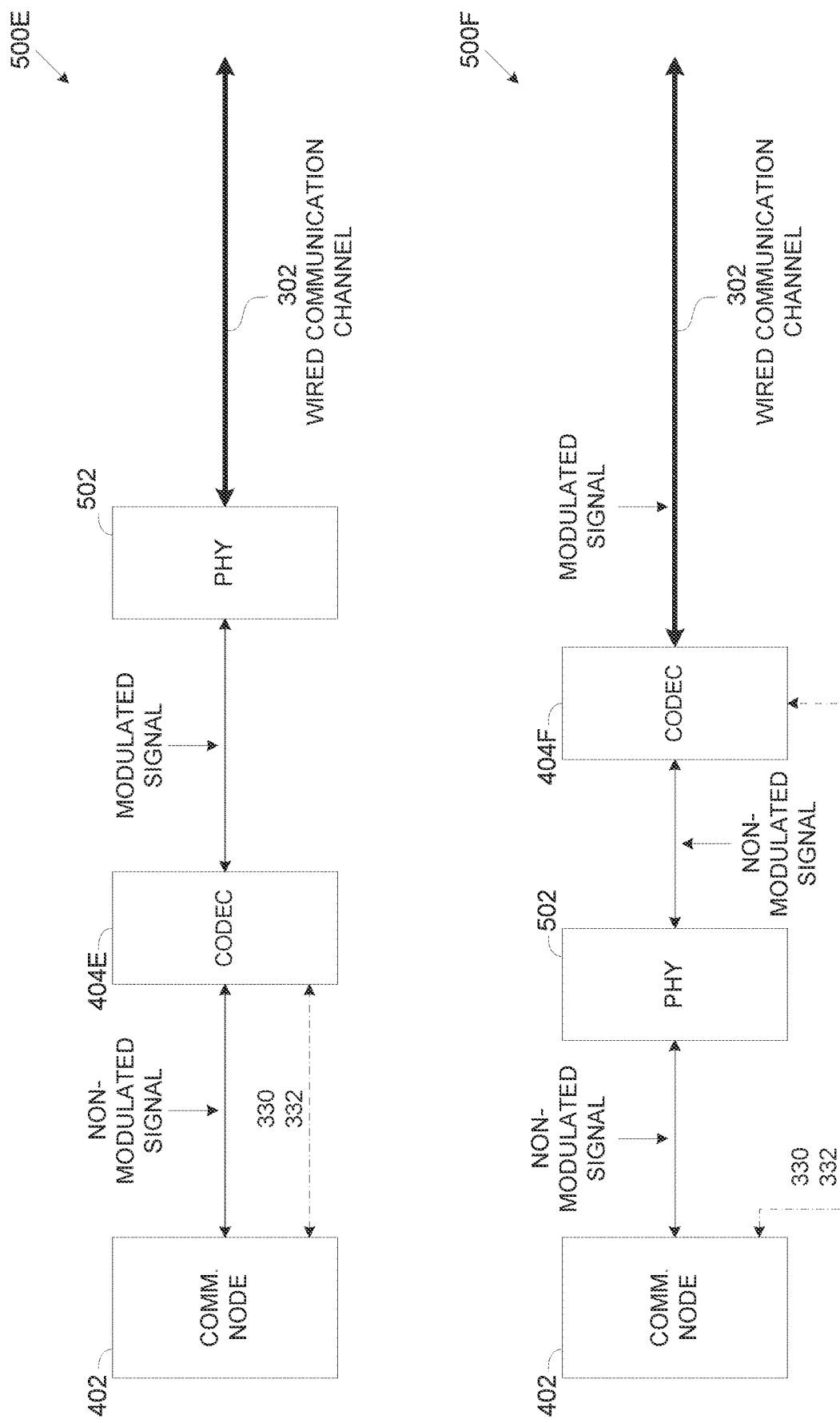

Reference is now made to FIG. 5A, FIG. 5B and FIG. 5C, which are schematic illustrations of exemplary embodiments of a codec implementation for modulating additional data on level transitions of a message signal transmitted on a wired communication channel, according to some embodiments of the present invention.

Exemplary implementations 500A, 500B, 500C, 500D and 500E present implementations of a codec such as the codec 404 associated with a communication node such as the communication node 402 for transmitting and/or receiving modulated signals over a wired communication channel such as the wired communication channel 302. This however, should not be construed as limiting since the same implementations, concepts, methodologies and/or techniques may be applied for implementing a separate encoder such as the encoder 320 and/or separate decoder such as the decoder 322. Moreover, the implementations of the codec 404 presented in 500A, 500B, 500C, 500D and 500E may be applied for various deployments of the a wired communication channel such as the wired communication channel 302, for example, the wired communication channel 302A, the wired communication channel 302B, the wired communication channel 302C and/or the like. Furthermore, the exemplary implementations 500A, 500B, 500C, 500D and 500E present a "buffer" implementation in which the codec 404 is placed between the communication node 402 and the wired communication channel 302. However, other connection implementation such as the "listener" and/or a combination of the "buffer" connection and "listener" connection may be applied to one or more of the exemplary implementations 500A, 500B, 500C, 500D and/or 500E.

In some deployments of the wired communication channel 302 a PHY 502 is coupled to one or more communication nodes such as the communication node 402 for conditioning one or more parameters of the signals transmitted over the wired communication channel 302, for example, a voltage level, a current drive, impedance and/or the like. While in some scenarios the PHY 502 may be integrated in one or more of the communication node 402, the PHY 502 may be implemented as separate hardware component, for example, a circuit, a component, an Integrated Circuit (IC) and/or the like.

As shown at 500A, a codec 404A such as the codec 404 may be implemented by one or more software modules, for example, a process, a script, an application, an agent, a utility, a tool and/or the like each comprising a plurality of program instructions stored in a non-transitory medium and executed by one or more processors, for example, a processor 510 of the communication node 402. In such case, on the transmitting path, the signal of the message generated by the communication node 402 is internally (inside the communication node 402) modulated by the codec 404A and the communication node 402 transmits the modulated signal over the wired communication channel 302, optionally through the PHY 502 (if exists). On the receiving path, the signal received from the wired communication channel 302, optionally through the PHY 502 (if exists) is the modulated signal which is internally demodulated by the codec 404A.

As shown at 500B, a codec 404B such as the codec 404 may be implemented by one or more logic elements, for example, a core, an Intellectual Property (IP) core and/or the like implemented in one or more ICs and optionally integrated with one or more other ICs, specifically in the communication node 402. As described for 500A, the signal transmitted and/or received by the communication node 402 is the modulated signal.

As shown at 500C, a codec 404C such as the codec 404 may be implemented by one or more logic elements, for example, a core, an IP core and/or the like implemented in one or more ICs and optionally integrated with one or more other ICs, specifically in the PHY 502. In such case, on the transmitting path, the message signal transmitted by the communication node 402 is a non-modulated signal, i.e. the pre-modulated signal which is modulated by the codec 404C to produce the modulated signal transmitted from the PHY 502 over the wired communication channel 302. On the receiving path, the signal received by the PHY 502 from the wired communication channel 302 is the modulated signal which is demodulated by the codec 404C to produce the non-modulated signal, i.e. the demodulated signal transmitted to the communication node 402.

As shown at 500D, a codec 404D such as the codec 404 may be implemented by one or more hardware components, for example, a circuit, a component, an IC, an Application Specific Integrated Circuit (ASIC), a Field Programmable Gate Array (FPGA), a Digital Signals Processor (DSP) and/or the like located between the communication node 402 and the wired communication channel 302. In such case, on the transmitting path, the message signal transmitted by the communication node 402 is the non-modulated signal, i.e. the pre-modulated signal which is modulated by the codec 404D to produce the modulated signal transmitted over the wired communication channel 302. On the receiving path, the signal received from the wired communication channel 302 is the modulated signal which is demodulated by the codec 404C to produce the demodulated signal (non-modulated signal) transmitted to the communication node 402.

As shown at 500E, a codec 404E such as the codec 404 may be implemented by one or more hardware components, for example, a circuit, a component, an IC, an ASIC, an FPGA, a DSP and/or the like located between the communication node 402 and the PHY 502 connected to the wired communication channel 302. In such case, on the transmitting path, the message signal transmitted by the communication node 402 is the non-modulated signal, i.e. the pre-modulated signal which is modulated by the codec 404E to produce the modulated signal transmitted by the PHY 502 over the wired communication channel 302. On the receiving path, the signal received from the wired communication channel 302 through the PHY 502 is the modulated signal which is demodulated by the codec 404E to produce the demodulated signal (non-modulated signal) transmitted to the communication node 402.

As shown at 500F, a codec 404F such as the codec 404 may be implemented by one or more hardware components, for example, a circuit, a component, an IC, an ASIC, an FPGA, a DSP and/or the like located between the PHY 502 and the wired communication channel 302. In such case, on the transmitting path, the message signal transmitted by the communication node 402 and conditioned by the PHY 502 is the non-modulated signal, i.e. the pre-modulated signal which is modulated by the codec 404F to produce the modulated signal transmitted over the wired communication channel 302. On the receiving path, the signal received from the wired communication channel 302 is the modulated signal which is demodulated by the codec 404E to produce the demodulated signal (non-modulated signal) transmitted to the communication node 402 via the PHY 502.

Reference is made once again to FIG. 1.

As shown at 102, the process 100 starts with the encoder 302 receiving a signal specifically the pre-modulated signal from the transmitting communication node 310. The signal generated by the transmitting communication node 310 has a waveform encoding data of a message to be transmitted over the wired communication channel 302 to one or more receiving communication nodes 320.

As shown at 104, the encoder 302 calculates one or more delay periods each associated with a respective level tran-sition of the signal waveform such that the encoder delays the respective level transition by the calculated delay period.

Each delay period consists of a number of delay time units which maps a respective data item (symbol) to be encoded in the message signal waveform. The mapping of the number of delay time units to data items is predefined. For example, zero delay units may map a first data item, for example, "00", one delay unit may map a second data item, for example, "01", two delay units may map a third data item, for example, "10", three delay units may map a fourth data item, for example, "11" and so on. Other mapping schemes may of course be applied for mapping data items to the number of delay time units.

The duration of the delay time units may be adapted according to one or more operational parameters of the communication protocol utilized by the wired communication channel 302, specifically timing parameters, for example, a frequency, an edge rise time of level transition, an edge fall time of the at least one transition, a propagation time, a jitter, a clock drift and an interference.

The maximum number of delay time units applied by the encoder 320 for calculating the delay period(s) may also be adapted according to one or more of the operational parameters of the communication protocol utilized by the wired communication channel 302. Naturally the larger the maximum number of delay time units, the higher the number of data items (symbols) which may be mapped by the number delay time units. For example, assuming the encoder 320 applies linear mapping, in case the maximum number of delay time units is two then three data items may be mapped. In another example, assuming the maximum number of delay time units is three then four data items may be mapped ($\log_2 4=2$ bits of information per symbol).

Adapting the duration and/or maximum number of the delay time units according to the timing parameters may be done to ensure that the overall delay period applied to the level transition(s) does not violate the timing parameters defined by the communication protocol. Such timing parameter(s) violation may significantly degrade the integrity of the signal waveforms in which the level transition(s) are delayed and may lead to communication failures. While the encoder 320 and/or the decoder 322 may be adapted to sustain such violation, legacy communication node(s) which do not have the decoder 322 may suffer major communication degradation.

Moreover, the duration of the delay time units may be adapted to sustain sufficient resolution to distinguish consecutive delay time units from each other in order to allow the decoder 320 to properly demodulate the delayed level transition(s) and correctly identify the number of delay time units applied to each level transition and extract the respective encoded data item accordingly.

The duration and/or maximum number of the delay time units may be further adapted to provide an optimal tradeoff between the number of data items which may be mapped by the number of delay time units and the resolution of the delay time units.

Optionally, the encoder 320 dynamically adapts in real-time the duration and/or maximum number of delay time units according to one or more of the operational parameters of the communication protocol. For example, the encoder 320 may detect in real-time a relatively high jitter in the signals transmitted over the wired communication channel 302. In such case the encoder 320 may increase the duration of the delay time units and/or reduce the maximum number of delay time units according to the detected jitter in order to prevent violation of the timing parameters defined by the communication protocol. In another example, the encoder 320 may detect in real-time the signals are transmitted over the wired communication channel 302 in a relatively low frequency. In such case the encoder 320 may reduce the duration of the delay time units and/or increase the maximum number of delay time units according to the detected frequency in order to increase the number of mapped data items and hence increase the data throughput achievable by the additional data items while complying (not violating) with the timing parameters defined by the communication protocol.

In order to maintain compatibility between the encoder 320 and the decoder 322 with respect to the encoding setting(s), for example, the duration and/or the maximum number of the delay time units, the encoder 320 may transmit one or more pilot message signals to the decoder 322 for calibration. The pilot signal(s) may include calibration information, specifically encoding settings, for example, the selected duration and/or maximum number of delay time units thus allowing the decoder 322 to calibrate and adjust itself to synchronize with the operation mode of the encoder 320. Using the pilot message signals may further allow dynamically adjusting the encoding setting(s) in real-time and using the pilot signal(s) to update the decoder about the adjusted encoding setting(s).

As shown at 106, the encoder 302 modulates the signal received from the transmitting communication node 310 with the data items (symbols) by delaying one or more of the level transition of the signal waveform by the respective delay period calculated for the level transition to encode the mapped data items.

While generating the modulated signal, the encoder 320 may avoid delaying at least some level transitions in the modulated signal waveform to support the decoder 322 in synchronizing its local sampling clock with the sampling clock used by the encoder 320 to generate the modulated signal and hence synchronize with the sampling clock of the transmitting communication node 310 from which the pre-modulated signal originates. For example, the encoder 320 may avoid delaying one or more initial level transitions in the beginning of the modulated signal to allow the decoder to first synchronize its local clock. In another example, the encoder 320 may avoid delaying one or more level transitions in one or more predefined segments of the modulated signal. The decoder 322 may be configured to identify the predefined segment(s) of the modulated signal and use the non-delayed level transition(s) in this segment(s) to synchronize its local clock.

Optionally, the encoder 320 delays one or more level transitions in the modulated signal with a predefined delay period which is reported and/or configured in the decoder 322.

Optionally, the encoder 320 modulates the signal by delaying only level transitions located at certain segments of the signal waveform while avoiding delaying level transitions in other segments of the signal waveform. The waveform segments in which the encoder 320 applies the delays may be predefined according to the communication protocol utilized on the wired communication channel. For example, the encoder 320 may apply the delays only for level transitions in the waveform encoding a data payload of the message while avoiding applying the delays to level transitions in protocol reserved segments (fields), for example, a header, a multi-access arbitration segment, a message identifier and/or the like. This may improve integrity of the communication protocol since in case of violation of the communication protocol timing parameters at worst only user data may be lost while protocol related data which is compliant with the communication protocol timing parameters is not affected thus preventing unrecoverable communication errors. In another example, the encoder 320 may avoid applying the delays to level transitions in one or more of the pilot signals, i.e. waveform segments of the signal which may be transmitted to support the decoder 322 to calibrate its decoding operation according to encoding settings reported by the encoder 320 and/or the like.

Reference is now made to FIG. 6, which is a schematic illustration of an exemplary message signal waveform modulated to encode additional data in the message signal, according to some embodiments of the present invention. A waveform 602 of an exemplary signal transmitted by a transmitting communication node such as the transmitting communication node 310 comprises a bit stream encoding data of a message to be transmitted over a wired communication channel such as the wired communication channel 302. Pulse duration of each bit in the bit stream is T. The waveform 602 includes several level transitions TR, for example, $TR_1$, $TR_2$, $TR_3$, $TR_4$, $TR_5$ and $TR_6$.

The waveform 602 may include one or more pilot signals, i.e. segments, for example, calibration data, synchronization pattern(s) and/or the like.

An encoder such as the encoder 320 may delay one or more of the level transitions TR by the delay period(s) calculated by the encoder 320 to encode respective data item(s). A waveform 604 presents a waveform of a modulated signal corresponding to the waveform 602 of the signal transmitted by the transmitting communication node 310. As seen, the encoder 320 delays each of the level transitions $TR_1$, $TR_2$, $TR_3$, $TR_4$, $TR_5$ and $TR_6$ by a respective delay period 610 encoding a respective mapped data item (symbol).

For example, designating $\delta T$ as the duration of each delay time unit, the encoder 320 delays the level transitions $TR_1$ by a delay period 610A consisting of two delay time units $\delta T$ such that the level of the waveform 604 transitions at $TR_1'$. In another example, the encoder 320 delays the level transitions $TR_2$ by a delay period 610B consisting of zero delay time units $\delta T$ such that the level of the waveform 604 transitions at $TR_2'$. In another example, the encoder 320 delays the level transitions $TR_3$ by a delay period 610C consisting of one delay time unit $\delta T$ such that the level of the waveform 604 transitions at $TR_3'$. In another example, the encoder 320 delays the level transitions $TR_4$ by a delay period 610D consisting of zero delay time units $\delta T$ such that the level of the waveform 604 transitions at $TR_4'$. In another example, the encoder 320 delays the level transitions $TR_5$ by a delay period 610E consisting of one delay time unit $\delta T$ such that the level of the waveform 604 transitions at $TR_5'$. In another example, the encoder 320 delays the level transitions $TR_6$ by a delay period 610F consisting of two delay time units $\delta T$ such that the level of the waveform 604 transitions at $TR_6'$.

Assuming the encoder 320 applies the linear mapping for mapping the additional data items to the number of delay time units, the mapping may be as follows: $0\delta T$ (zero delay time units) encodes the data item "00", $1\delta T$ (one delay time unit) encodes the data item "01" and $2\delta T$ (two delay time units) encodes the data item "10". The encoder 320 therefore encodes the data item "10" in the level transition $TR_1'$, the data item "00" in the level transition $TR_2'$, the data item "01" in the level transition $TR_3'$, the data item "00" in the level transition $TR_4'$, the data item "01" in the level transition $TR_5'$ and the data item "10" in the level transition $TR_6'$.

In another data items mapping example, the encoder 320 may use a recursive function to perform a modular integration of the data items. Applying this mapping, the encoder 320 may sum the data-items, calculate the data items modulo (with the maximal data item value plus 1) and delay the respective level transition by the resulting number of delay units. For the exemplary modulated signal 604, the encoder 320 may compute delay periods $S_j=\{0, 2, 0, 1, 0, 1, 2\}$ derived from encoding the following additional data items $S_j'=\{0, 2, 2, 1, 3, 1, 1\}$ (The recursive mapping function in this case would be $S_0=0$, $S_j=\text{mod}(S_{j-1}+S_j', 2^{symbol\ size\ in\ bits})$. This data items mapping scheme may simplify the implementation of the decoder 322 and may present improved performance in terms of error immunity.

As seen from the waveforms 602 and 604, while the bit stream of the message may encode 9 bits, the additional data items encoded in the level transitions may include 6 level transitions each mapping one of four data items (symbols) {00,01,10,11} that may be mapped by three delay time periods thus allowing encoding of up to 12 bits. The modulation of the signal may therefore significantly increase the data encoded in the modulated signal while imposing no utilization impact to the wired communication channel 302.

Reference is made once again to FIG. 1.

As shown at 108, the encoder 302 transmits the modulated signal over the wired communication channel 320 to one or more receiving communication nodes 312.

The modulated signal transmitted by the encoder 320 includes one or more level transitions which are not delayed at the beginning of the modulated signal waveform to support the decoder 322 in synchronizing its local sampling clock with the sampling clock used by the encoder 320 to generate the modulated signal and hence in synchronizing with the sampling clock of the transmitting communication node 310 from which the pre-modulated signal originates.

The delay periods applied by the encoder 320 to generate the modulated signal are transparent to legacy communication nodes such as the communication node 402 which do not have the decoder 322. The legacy communication nodes 402 therefore decode and interpret the received modulated signal as if the modulated signal was the non-modulated signal such that the legacy communication nodes 402 may decode the message and its encoded data while completely oblivious to the additional data item(s) encoded in the level transitions of the modulated signal.

Optionally, the encoder 320 transmits one or more of the pilot signals to report of one or more encoding settings to support the decoder 322 in calibrating the decoding operation according to encoding setting.

Optionally, the encoder 320 applies null modulation to one or more signal waveforms such that no delay periods are applied to any of the level transitions in the waveform. For example, assuming the encoder 320 is connected as the "buffer" between the transmitting communication node 310 and the wired communication channel 302. In such case, for each of the level transitions, the encoder 320 may calculate a constant delay period consisting of zero delay time units such that all the level transitions of the modulated signal waveform follow the level transitions of the pre-modulated signal waveform received from the transmitting communication node 310. In another example, assuming the encoder 320 is connected to the wired communication channel 302 as the "listener" in parallel to the transmitting communication node 310. In such case the encoder 320 may be simply disabled, turned off and/or the like while the transmitting communication node 310 transmits the message(s) over the wired communication channel 302.

Optionally, the encoder 320 scrambles/whitens one or more segments of the pre-modulated signal waveform by replacing the data encoded in the segment(s) with alternative data. One or more of these segments may be scrambled to encode the data according to a different coding scheme in order to increase the number of level transitions and hence increase the number of data items which may be encoded in the modulated signal.

The encoder 320 may report the data rate settings to the decoder 322 through one or more of the pilot signals which may optionally be non-modulated and moreover transmitted in the data rate originally set for the wired communication channel 302.

Optionally, the encoder 320 pairs (couples) the data encoded in the original pre-modulated signal with the data items encoded in the level transitions of the modulated signal. Coupling the message data with the additional data items encoded in the level transitions may have some major advantages. First, in case the data is encrypted, the message data and/or the additional data items may not be decoded separately. A receiver (or interceptor) of the modulated signal must have be familiar (i.e. decode) both the message data and the additional data items in order to decrypt the message data and the additional data items. Moreover, by coupling the message data and the additional data items, at least part of the modulated signal may be scrambled with no extra effort, cost and/or resources (e.g. computation resources, storage resources, computing time, etc.). The coupling method may optionally be by XOR'ing the pre-modulated signal bit values or/and length with the modulated symbols prior to the modulation process.

Figure 7:
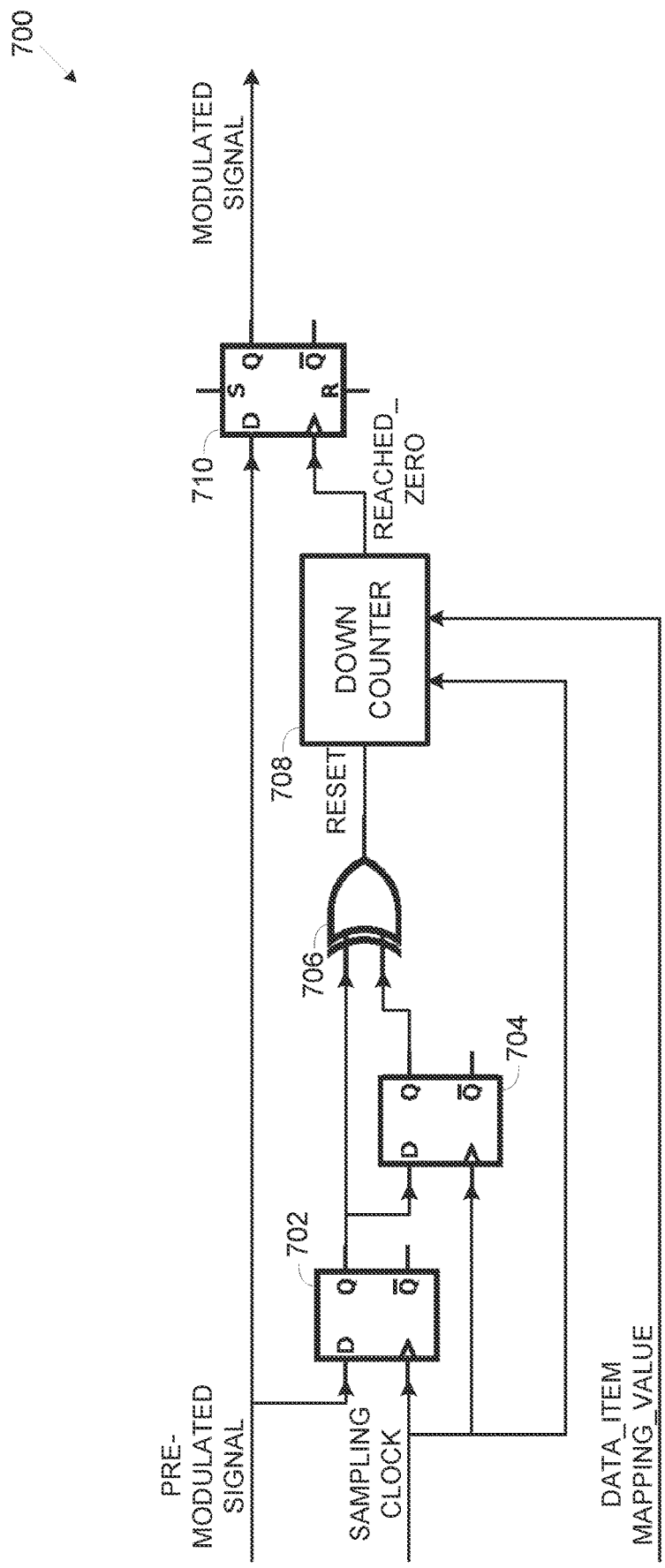
FIG. 7 is a schematic illustration of an exemplary circuit for encoding additional data in level transitions of a message signal where the additional data is paired with the message data, according to some embodiments of the present invention.

Reference is now made to FIG. 7, which is a schematic illustration of an exemplary circuit for encoding additional data in level transitions of a message signal where the additional data is paired with the message data, according to some embodiments of the present invention. An exemplary logic circuit 700 may be applied by an encoder such as the encoder 320 for pairing the additional data items encoded in the level transitions of the modulated signal with the message data carried by the pre-modulated signal received from a transmitting communication node such as the transmitting communication node 310. The logic circuit 700 implements a minimal delay modulator comprising an edge detection circuit, a down counter 708 and a gating D-FlipFlop 710 for gating the pre-modulated signal until a "reached_zero" signal outputted from the down counter rises. The down counter 708 receives the sampling clock of the transmitting communication node 310 and a "data_item_mapping_value" which maps an additional data item to be modulated in the detected level transition of the pre-modulated signal. The "data_item_mapping_value" maps the additional data item according to the selected encoding mapping scheme. The edge detection circuit constructed of a first D-FlipFlop 702, a second D-FlipFlop 704 and a XOR gate 706 is configured to detect level transitions (edge) in the waveform of the pre-modulated signal and upon detection of a transition the edge detection circuit switches its output "reset" signal to logic high to resets the down counter 708. On reset, the down counter 708 loads a new "data_item_mapping_value" and starts counting down from the loaded "data_item_mapping_value" to zero to create the delay period consisting of the number of delay time units mapped by the "data_item_mapping_value". When the down counter 708 reaches zero it switches its "reached_zero" output signal to a high level. Once the "reached_zero" signal rises, the pre-modulated signal propagates out of the gating D-Flip- Flop 710 thus creating the modulated signal delayed by the appropriate delay period and outputted from the encoder 320.

Reference is made once again to FIG. 2.

A shown at 202, the process 200 starts with the decoder 322 receiving the modulated signal transmitted over the wired communication channel 302 from the encoder 320.

The decoder 322 may optionally receive one or more of the pilot signals from the encoder 320 which may report of one or more of the encoding setting applied by the encoder 320 for encoding the modulate signal.

A shown at 204, the decoder 322 synchronizes its local sampling clock to the sampling clock of the encoder 320 and hence to the sampling clock of the transmitting communication node 310 by extracting (recovering) the sampling clock from the modulated signal. The decoder 332 may apply one or more methods for extracting the sampling clock of the transmitting communication node 310 from the modulated signal. For example, the decoder 322 may extract the modulated signal sampling clock based on one or more level transitions of the modulated signal which are not delayed, specifically, but not limited to, at the beginning of the modulated signal waveform. In another example, the decoder 322 may extract the modulated signal sampling clock based on one or more level transitions of the modulated signal which are delayed by the predefined delay period.

The decoder 322 may apply one or more clock recovery techniques as known in the art, for example, a Phase-Locked Loop (PLL), a Delay-Locked Loop (DLL) and/or the like for extracting the clock form the modulated signal to synchronize the local sampling clock of the decoder 322 to the sampling clock of the encoder 320.

A shown at 206, the decoder 322 demodulates the modulated signal to extract the additional data item(s) encoded in one or more of the level transitions of the modulated signal waveform. The decoder 322 demodulates the modulated signal by detecting the number of delay time units applied to delay one or more of the level transitions of the modulated signal and extract the additional data item(s) according to the mapping of the number of delay time units to the data items (symbols). The decoder 322 may apply one or more techniques for detecting the number of delay time units applied to delay the level transition(s) of the modulated signal.

For example, the decoder 322 may measure a time period between each (current) level transition and a preceding level transition to determine the number of delay time units applied to the current level transition. Measuring this time period may be performed to measure the delay period which may later be processed to extract the number of delay time units applied by the encoder 320 to the level transition. The decoder 322 may use the encoding settings provided by the encoder 320 to determine the mapping of the number of delay time units to the additional data items (symbols) applied by the encoder 320. In case of the linear mapping, the decoder 322 may apply the formulation presented in equation 1 below to determine the number of delay time units applied to each level transition.

$$\text{Symbol}_i'(N) = \text{round}\left(\frac{\text{mmod}(D(N), T)}{\delta T}\right) \quad \text{Equation 1}$$

$$\text{Symbol}(N) = \sum_{n=0}^{N} \text{Symbol}_i'(N)$$

Where $\delta T$ is the duration of each delay time unit, T is the pulse duration of each transmitted bit (nominal bit time), D(N) is the N'th measured time-delay and N is the level transition index.

Notes:
(1) In this formulation and throughout the document "mmod(x)" denotes a modified modulo. The operation if formulated as follows:

$$\text{mmod}(N, T) = \begin{cases} \text{mod}(N, T) & \text{mod}(N, T) < \frac{T}{2} \\ \text{mod}(N, T) - T & \text{otherwise} \end{cases}$$

$$\text{mod}(N, T) = N - T \cdot \left\lfloor \frac{N}{T} \right\rfloor$$

(2) In the current and following examples, in cases where Symbol$_i$(N) exceeds the minimal/maximal symbol levels, it can be truncated to the minimal/maximal value respectively. For example, for 2 bit symbols, the symbol values are in the range of [0 . . . 3]. If the resulting number is negative, the resulting number may be truncated to 0, and if the value exceeds 3 the resulting number may be truncated to 3.

In another example, in the case of the recursive mapping, the decoder 322 may apply the formulation presented in equation 2 below to extract the data units from the stream.

$$\text{Symbol}_i'(N) = \text{round}\left(\frac{\text{mmod}(D(N), T)}{\delta T}\right) \quad \text{Equation 2}$$

$$\text{Symbol}(N) = \begin{cases} \text{Symbol}_i'(N) & \text{Symbol}_i'(N) \geq 0 \\ S_{max} + \text{Symbol}_i'(N) & \text{otherwise} \end{cases}$$

Where $S_{max} = 2^{S_{len}}$, $S_{len}$ is the length of a data item (symbol), i.e. number of bits of the data item, N is the level transition index, $\delta T$ is the duration of each delay time unit, D(N) is the N'th measured time-delay and T is the pulse duration of each transmitted bit (nominal bit time).

In another example, the decoder 332 may measure a time period between one or more reference points, for example, a most recent un-delayed level transition and each of one or more succeeding level transitions to determine the number of delay time units applied to the succeeding level transition(s). The decoder 322 may apply the formulation presented in equation 3 below to determine the number of delay time units applied to each level transition.

$$\text{Symbol}_i'(N) = \text{round}\left(\frac{\text{mmod}(D(N), T)}{\delta T}\right) \quad \text{Equation 3}$$

$$\text{Symbol}(N) = \text{Symbol}_i'(N)$$

Where $\delta T$ is the duration of each delay time unit and T is the pulse duration of each transmitted bit (nominal bit time), D(N) is the N'th measured time-delay and N is the level transition index.

Figure 8:
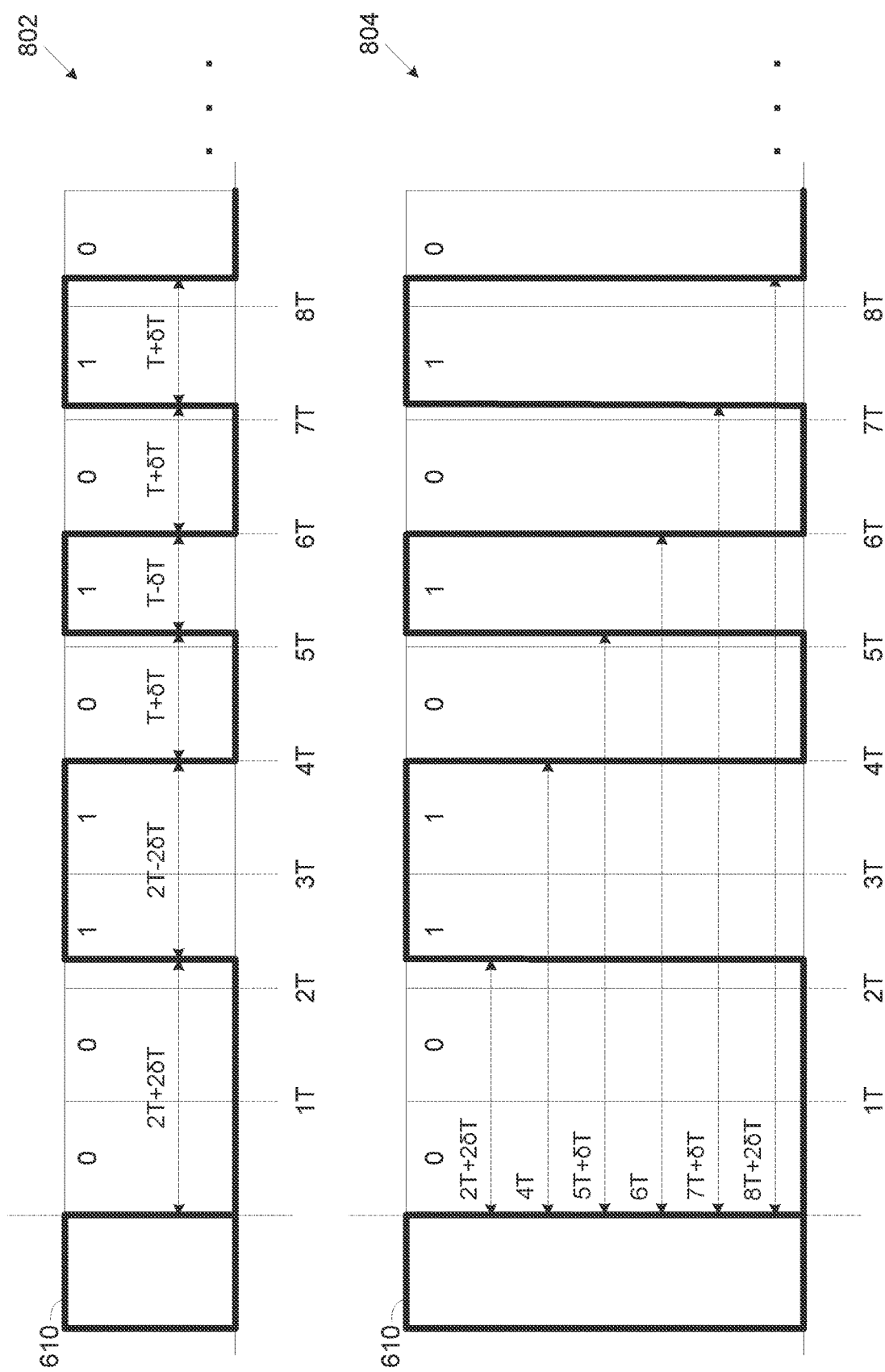
FIG. 8 is a schematic illustration of an exemplary message signal waveform demodulated to decode additional data encoded in the message signal, according to some embodiments of the present invention.

Reference is now made to FIG. 8, which is a schematic illustration of an exemplary message signal waveform demodulated to decode additional data encoded in the message signal, according to some embodiments of the present invention. Waveforms 802 and 804 of an exemplary modulated signal received by a decoder such as the decoder 322 from an encoder such as the encoder 320 correspond to the waveform 604 of the modulated signal transmitted by the encoder 320 over a wired communication channel such as the wired communication channel 302.

Waveform 802 presents an exemplary waveform that can be decoded by decoder 322 by applying the linear mapping for determining the number of delay time units applied to each level transition as formulated in equation 1. The calculation is presented in equation 4 below.

Equation 4

$$\text{Symbol}(N) = \sum_{n=0}^{N} \text{round}\left(\frac{m\text{mod}(D(N), T)}{\delta T}\right)$$

$$\Rightarrow \text{Symbol}(N) = \text{cumsum}\{2, -2, 1, -1, 1, 1\} = \{2, 0, 1, 0, 1, 2\}$$

In case the recursive mapping is applied to the modulated signal by the encoder 320, the decoder 322 may extract the additional data items from the waveform 802 as formulated in equation 2. The calculation is presented in equation 5 below for $S_{len}=2$, i.e. the number of bits per data item (symbol) is 2.

Equation 5

$$\text{Symbol}_i(N) = \text{round}\left(\frac{m\text{mod}(D(N), T)}{\delta T}\right) = \{2, -2, 1, -1, 1, 1\}$$

$$\Rightarrow \text{Symbol}(N) = \begin{cases} \text{Symbol}_i(N) & \text{Symbol}_i(N) \geq 0 \\ S_{max} + \text{Symbol}_i(N) & \text{otherwise} \end{cases} = \{2, 2, 1, 3, 1, 1\} = \{2, 4-2, 1, 4-1, 1, 1\}$$

Waveform 804 presents a decoding flow of the decoder 322 applying the second method for determining the number of delay time units applied to each level transition as formulated in equation 2. The calculation is presented in equation 6 below.

Equation 6

Symbol (N) =

$$\text{Symbol}_i(N) = \text{round}\left(\frac{m\text{mod}(D(N), T)}{\delta T}\right) \Rightarrow \text{Symbols} = \{2, 0, 1, 0, 1, 2\}$$

In case the encoding of the additional data item(s) is paired with the message data, the decoder may recover both the additional data item(s) encoded in the modulated signal and the a recovered version of the modulated signal corresponding to the original pre-modulated signal generated by the transmitting communication node 310.

Figure 9:
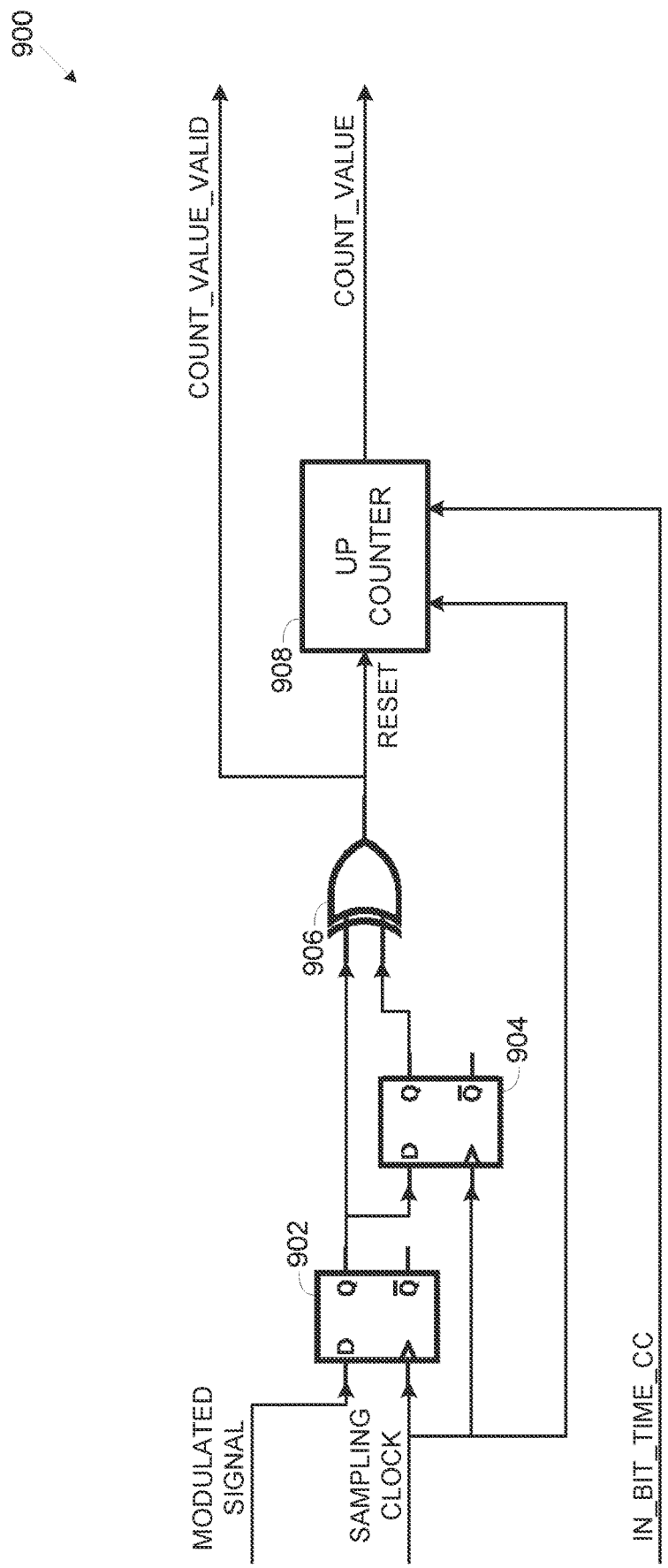
FIG. 9 is a schematic illustration of an exemplary circuit for decoding additional data encoded in level transitions of a message signal where the additional data is paired with the message data, according to some embodiments of the present invention.

Reference is now made to FIG. 9, which is a schematic illustration of an exemplary circuit for decoding additional data from level transitions of a message signal where the additional data is paired with the message data, according to some embodiments of the present invention. An exemplary logic circuit 900 may be applied by a decoder such as the decoder 322 to perform time measurements needed for decoding a modulated signal comprising data items encoded in the level transitions of the modulated signal. The logic circuit 900 configured to count time delays between consecutive level transitions in the waveform of the received modulated signal contains an edge detector circuit and an up counter circuit 908. The edge detector circuit constructed of a first D-FlipFlop 902, a second D-FlipFlop 904 and a XOR gate 906 is configured to receive the modulated signal as input and synchronize detected level transitions (edges) in the waveform of the modulated signal with the sampling clock of the decoder 322 recovered from the modulated signal. The up-counter 908 receiving the sampling clock of the decoder 322 may increment its internal count value every clock cycle (CC) of the sampling clock. The up counter 908 also receives an "in_bit_time_cc" signal which represents the number of clock cycles (CC) of a single bit duration (nominal bit time), i.e. T, the pulse duration. When the count value exceeds the number of CC per pulse duration the count value wraps around to form a modulo counter. Once an edge is detected, the edge detector circuit outputs a "count_value_valid" signal which indicates that a "count_value" outputted by the up-counter 908 is valid and indicates the delay count (in terms of CC) between the previously detected transition (edge) and the current edge. The "count_value_valid" signal also resets the up-counter 908 to start counting the delay count until the next edge. The "count_value" may be further analyzed to extract the actual additional data-items from the modulated signal.

Reference made once again to FIG. 2.

As shown at 208, the decoder 332 may output the additional data item(s) extracted from the modulated signal.

The decoder 322 may further output (e.g. transmit, provide, forward, etc.) a recovered version of the demodulated signal, i.e. the demodulated signal to the receiving communication node 312 which may decode the demodulated signal to extract the message data.

The decoder 332 may output the additional data item(s) encoded in the modulated signal level transition(s) to one or more devices either integrated and/or separated from the decoder 332. For example, the decoder 332 may transmit, forward, provide and/or the like the additional data item(s) to the receiving communication node 312. In another example, the decoder 332 may output the additional data item(s) for one or more goals, objectives and/or applications.

In one exemplary use case, the signal modulation to encode the additional data items by delaying the level transitions of the signal waveform may be used for increasing the throughput of data transmitted over the wired communication channel 302. Moreover, while increasing the data throughput by transmitting the modulated signal requires similar utilization of the communication channel 302 as when requires for transmitting the non-modulated signal. This means that no alterations such as, for example, increased data rate, increased frequency, additional transmissions and/or the like are required to the communication protocol utilized on the wired communication channel 302 to significantly increase the data throughput.

In another exemplary use case, the signal modulation to encode the additional data items by delaying the level transitions of the signal waveform may be used for adding protocol related data to enhance the communication protocol utilized by the wired communication channel 302, for example, adding protocol related control/status information, adding features to enhance the communication protocol and/or the like.

In another exemplary use case, the signal modulation to encode the additional data items by delaying the level transitions of the signal waveform may be used for authenticating the originating transmitting communication node 310. For example, each of the legitimate (valid, genuine) communication nodes 402 capable of performing as the transmitting communication node 310 and transmit messages over the wired communication channel 302 may be assigned a unique identifier. The encoder 320 associated with each of such communication nodes 402 may therefore encode the identifier of its associated communication nodes 402 in the modulated signal(s) transmitted over the wired communication channel 302. Recipients of the modulated signal, i.e. one or more other communication node 402 performing as receiving communication nodes 310 may validate the encoded identifier to verify the message(s) is received from a legitimate communication node 402.

In another exemplary use case, the signal modulation to encode the additional data items by delaying the level transitions of the signal waveform may be used for message authentication and encryption of the message data. The message data coupled with the additional data items may be encrypted using one or more encryption keys such that the message data cannot be deciphered without having the respective encryption key(s). For example, a private-public key scheme may be employed using the additional data items to validate both the originating communication node of the message(s) as well as the messages validity, i.e. verify the message content is genuine and has not been altered since transmitted by the originator.

In another exemplary use case, the signal modulation to encode the additional data items by delaying the level transitions of the signal waveform may be used for error detection and correction in the message data. The additional data item(s) may be used to include ECC information for the message data such that the decoder 322 decoding the modulated signal and extracting the ECC information may apply ECC to the message data using the ECC information.

In another exemplary use case, the signal modulation to encode the additional data items by delaying the level transitions of the signal waveform may be used for software and/or firmware upgrades and/or updates. The throughput of the wired communication channel 302 which may be limited may be insufficient for transferring software update data and/or may require extended time for transferring large volumes of software update data. The additional data item(s) may therefore be used to include the software update data elements to enable and/or to significantly reduce the time required for the software and/or firmware upgrade.

It is expected that during the life of a patent maturing from this application many relevant systems, platforms, methods and computer programs will be developed and the scope of the terms wired communication channels and communication protocols are intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

The word "exemplary" is used herein to mean "serving as an example, an instance or an illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. An encoder for modulating data on level transitions of a signal transmitted on a wired communication channel to increase channel data throughput, comprising:
    an encoder circuitry configured for:
        receiving a signal transmitted by a transmitting communication node, the signal carries a message to at least one receiving communication node connected to a wired communication channel;
        calculating a respective delay period consisting of a number of delay time units and encoding each of a plurality of data items according to at least one recursive mapping scheme defining calculation of the respective delay period according to the formulation:

$S_0 = 0$ $S_j = \mathrm{mod}(S_{j-1} + S_j', 2^{symbol\ size\ in\ bits})$ wherein $S_0$ is a first symbol encoded by a respective delay period to map a first data unit and $S_j$ is a $j^{th}$ symbol encoded by a respective delay period to map a respective $j^{th}$ data item for j>0;
    delaying each of a plurality of transitions of a waveform level of the signal by the respective delay period to modulate the signal to carry the plurality of data items; and
    transmitting the modulated signal to the at least one receiving communication node having a decoder configured for demodulating the modulated signal to recover the plurality of data items each recursively mapped by the respective delay period thus improving immunity of the modulated signal to errors induced by at least one operational parameter of the wired communication channel, wherein the recovery is done according to the formulation:

$$S_i(N) = \mathrm{round}\left(\frac{m\mathrm{mod}(D(N), T)}{\delta T}\right)$$

$$S(N) = \begin{cases} S_i(N) & Symbol_i(N) \geq 0 \\ S_{max} + S_i(N) & \text{otherwise} \end{cases}$$

wherein $S_i$ is an $i^{th}$ symbol encoded by a respective delay unit to map a respective $i^{th}$ data item, N is a level transition index, D(N) is a measured time-delay, $\delta T$ is the duration of each delay time unit and $S_{max} = 2^{S_{len}}$ where $S_{len}$ is the length of a single symbol and mmod (N, T) is defined by:

$$m\mathrm{mod}(N, T) = \begin{cases} \mathrm{mod}(N, T) & \mathrm{mod}(N, T) < \frac{T}{2} \\ \mathrm{mod}(N, T) - T & \text{otherwise} \end{cases}$$

wherein $$\mathrm{mod}(N, T) = N - T \cdot \left\lfloor \frac{N}{T} \right\rfloor$$

is the modulo function.

2. The encoder of claim 1, wherein the encoder circuitry is implemented in at least one form which is a member of a group consisting of: a hardware circuit, an integrated circuit (IC), a semiconductor intellectual property core (IP core), a software module, and a combination of at least two members thereof.

3. The encoder of claim 1, wherein at least one of the plurality of data items is used for transmitting additional data in addition to data of the message to increase a data throughput of the wired communication channel.

4. The encoder of claim 1, wherein at least one of the plurality of data items is used for transmitting additional protocol data related to a communication protocol utilized by the wired communication channel for enhancing the communication protocol.

5. The encoder of claim 1, wherein at least one delayed level transition of the plurality of transitions is preceded by at least some non-delayed level transitions used by the decoder of at least one receiving communication node for synchronizing to the sampling clock of the signal.

6. The encoder of claim 1, the encoder circuitry is further configured for transmitting at least one pilot signal used for calibrating the modulation between the encoder and the decoder.

7. The encoder of claim 1, wherein a duration of each delay time unit is adapted according to at least one operational parameter of a communication protocol utilized by the wired communication channel, the at least one operational parameter is a member of a group consisting of: a frequency, an edge rise time of a level transition, an edge fall time a level transition, a propagation time, a jitter, a clock drift and an interference.

8. The encoder of claim 1, wherein a maximum number of delay time units applied to delay each of the plurality of level transitions is adapted according to at least one operational parameter of a communication protocol utilized by the wired communication channel, the at least one operational parameter is a member of a group consisting of: a frequency, an edge rise time of a level transition, an edge fall time of a level transition, a propagation time, a jitter, a clock drift and an interference.

9. The encoder of claim 1, wherein the encoder circuitry is further configured for delaying the plurality of level transitions in at least one segment of the waveform, the at least one segment is defined according to a communication protocol utilized by the wired communication channel.

10. The encoder of claim 1, wherein the respective delay period applied to each of the plurality of level transitions is functionally transparent to legacy communication nodes connected to the wired communication channel and having no decoder.

11. The encoder of claim 1, wherein the encoder circuitry is further configured for applying a null modulation to the modulated signal by constructing the delay period to include zero delay time units for all level transitions in the waveform of the signal.

12. The encoder of claim 1, wherein the encoder circuitry is further configured for scrambling at least one segment of the waveform to replace data encoded in the at least one scrambled segment with alternative data to increase a number of level transitions of the at least one segment thus increasing the number of the plurality of data items encoded in the plurality of level transitions.

13. The encoder of claim 1, wherein the encoder circuitry is further configured for pairing at least one of the plurality of data items with at least some data of the message to make the at least one data item decodable based on the at least some message data.

14. The encoder of claim 1, wherein at least one of the plurality of data items is used for at least one of:
- authenticating the transmitting communication node as originator of the message,
- authenticating the message,
- transmitting error detection and correction data calculated for data of the message, and
- transmitting update data for at least one of: a software update and a firmware update.

15. A method of modulating data on level transitions of a signal transmitted on a wired communication channel to increase channel data throughput, comprising:
- receiving a signal transmitted by a transmitting communication node, the signal carries a message to at least one receiving communication node connected to a wired communication channel;
- calculating a respective delay period consisting of a number of delay time units and encoding each of a plurality of data items according to at least one recursive mapping scheme defining calculation of the respective delay period according to the formulation:

$$S_0 = 0$$

$$S_j = \mathrm{mod}(S_{j-1} + S_j', 2^{\text{symbol size in bits}})$$

wherein $S_0$ is a first symbol encoded by a respective delay period to map a first data unit and $S_j$ is a $j^{th}$ symbol encoded by a respective delay period to map a respective $j^{th}$ data item for $j>0$;
- delaying each of a plurality of transitions of a waveform level of the signal by the respective delay period to modulate the signal to carry the plurality of data items; and
- transmitting the modulated signal to the at least one receiving communication node having a decoder configured for demodulating the modulated signal to recover the plurality of data items each recursively mapped by the respective delay period thus improving immunity of the modulated signal to errors induced by at least one operational parameter of the wired communication channel, wherein the recovery is done according to the formulation:

$$S_i(N) = \mathrm{round}\left(\frac{m\mathrm{mod}(D(N), T)}{\delta T}\right)$$

$$S(N) = \begin{cases} S_i(N) & \text{Symbol}_i(N) \geq 0 \\ S_{max} + S_i(N) & \text{otherwise} \end{cases}$$

wherein $S_i$ is an $i^{th}$ symbol encoded by a respective delay unit to map a respective $i^{th}$ data item, N is a level transition index, D(N) is a measured time-delay, $\delta T$ is the duration of each delay time unit and $S_{max} = 2^{S_{len}}$ where $S_{len}$ is the length of a single symbol and mmod (N, T) is defined by:

$$m\mathrm{mod}(N, T) = \begin{cases} \mathrm{mod}(N, T) & \mathrm{mod}(N, T) < \frac{T}{2} \\ \mathrm{mod}(N, T) - T & \text{otherwise} \end{cases}$$

wherein $$\mathrm{mod}(N, T) = N - T \cdot \left\lfloor \frac{N}{T} \right\rfloor$$

is the modulo function.

16. A decoder for demodulating data encoded on level transitions of a modulated signal transmitted on a wired communication channel to increase channel data throughput, comprising:
a decoder circuitry configured for:
- receiving a modulated signal from an encoder connected to a wired communication channel, the modulated signal generated by a transmitting communication node carries a message and further carries a plurality of data items encoded in a plurality of level transitions of the modulated signal;
- synchronize a local sampling clock to a sampling clock of the transmitting communication node extracted from the modulated signal;
- demodulating the modulated signal to extract the plurality of data items carried by the modulated signal according to the formulation:

$$S_i(N) = \mathrm{round}\left(\frac{m\mathrm{mod}(D(N), T)}{\delta T}\right)$$

$$S(N) = \begin{cases} S_i(N) & \text{Symbol}_i(N) \geq 0 \\ S_{max} + S_i(N) & \text{otherwise} \end{cases}$$

wherein $S_i$ is an $i^{th}$ symbol encoded by a respective delay unit to map a respective $i^{th}$ data item, N is a level transition index, D(N) is a measured time-delay, $\delta T$ is the duration of each delay time unit and $S_{max} = 2^{S_{len}}$ where $S_{len}$ is the length of a single symbol and mmod (N, T) is defined by:

$$m\mathrm{mod}(N, T) = \begin{cases} \mathrm{mod}(N, T) & \mathrm{mod}(N, T) < \frac{T}{2} \\ \mathrm{mod}(N, T) - T & \text{otherwise} \end{cases}$$

wherein $$\mathrm{mod}(N, T) = N - T \cdot \left\lfloor \frac{N}{T} \right\rfloor$$

is the modulo function; and
- outputting the plurality of extracted data items.

17. The decoder of claim 16, wherein the decoder circuitry is configured for outputting a recovered version of the modulated signal for extracting data of the message.

18. The decoder of claim 16, wherein the decoder circuitry is configured for synchronizing the local sampling clock by sampling at least some non-delayed level transitions of the waveform preceding the plurality of level transitions.

19. The decoder of claim 16, wherein the decoder circuitry is configured for synchronizing the local sampling clock by sampling at least some predefined delayed level transitions of the waveform preceding the plurality of level transitions, each of the at least some predefined delayed level transitions is delayed by a predefined delay period.

20. A method of demodulating data encoded on level transitions of a modulated signal transmitted on a wired communication channel to increase channel data throughput, comprising:
receiving a modulated signal from an encoder connected to a wired communication channel, the modulated signal generated by a transmitting communication node carries a message and further carries a plurality of data items encoded in a plurality of level transitions of the modulated signal;
synchronizing a local sampling clock to a sampling clock of the transmitting communication node extracted from the modulated signal;
demodulating the modulated signal to extract the plurality of data items carried by the modulated signal according to the formulation:

$$S_i(N) = \text{round}\left(\frac{m\text{mod}(D(N), T)}{\delta T}\right)$$

$$S(N) = \begin{cases} S_i(N) & Symbol_i(N) \geq 0 \\ S_{max} + S_i(N) & \text{otherwise} \end{cases}$$

wherein $S_i$ is an $i^{th}$ symbol encoded by a respective delay unit to map a respective $i^{th}$ data item, N is a level transition index, D(N) is a measured time-delay, $\delta T$ is the duration of each delay time unit and $S_{max} = 2^{S_{len}}$ where $S_{len}$ is the length of a single symbol and mmod(N, T) is defined by:

$$m\text{mod}(N, T) = \begin{cases} \text{mod}(N, T) & \text{mod}(N, T) < \frac{T}{2} \\ \text{mod}(N, T) - T & \text{otherwise} \end{cases}$$

wherein $$\text{mod}(N, T) = N - T \cdot \left\lfloor \frac{N}{T} \right\rfloor$$

is the modulo function; and
outputting the plurality of extracted data items.

* * * * *